(12) United States Patent
Parham et al.

(10) Patent No.: US 8,901,298 B2
(45) Date of Patent: Dec. 2, 2014

(54) MATERIALS FOR ORGANIC ELECTROLUMINESCENCE DEVICES

(75) Inventors: Amir Hossain Parham, Frankfurt (DE); Christof Pflumm, Frankfurt (DE); Holger Heil, Frankfurt (DE); Arne Buesing, Frankfurt (DE)

(73) Assignee: Merck Patent GmbH (DE)

( * ) Notice: Subject to any disclaimer, the term of this patent is extended or adjusted under 35 U.S.C. 154(b) by 354 days.

(21) Appl. No.: 13/000,159

(22) PCT Filed: Oct. 1, 2009

(86) PCT No.: PCT/EP2009/007046
§ 371 (c)(1),
(2), (4) Date: Dec. 20, 2010

(87) PCT Pub. No.: WO2010/049050
PCT Pub. Date: May 6, 2010

(65) Prior Publication Data
US 2011/0112275 A1 May 12, 2011

(30) Foreign Application Priority Data
Oct. 31, 2008 (DE) .......... 10 2008 054 141

(51) Int. Cl.
| | |
|---|---|
| *C07D 251/24* | (2006.01) |
| *C07D 221/18* | (2006.01) |
| *C07D 235/18* | (2006.01) |
| *C07D 209/56* | (2006.01) |
| *C07D 333/50* | (2006.01) |
| *C07D 311/78* | (2006.01) |
| *C07D 211/54* | (2006.01) |
| *C09K 19/04* | (2006.01) |
| *H01J 1/62* | (2006.01) |
| *H01L 51/00* | (2006.01) |
| *C09K 11/06* | (2006.01) |
| *H05B 33/14* | (2006.01) |
| *H01L 51/50* | (2006.01) |

(52) U.S. Cl.
CPC ...... H01L 51/006 (2013.01); *C09K 2211/1044* (2013.01); *H01L 51/5048* (2013.01); *C09K 2211/1088* (2013.01); H01L 51/0055 (2013.01); *C09K 2211/1092* (2013.01); C09K 11/06 (2013.01); H05B 33/14 (2013.01); *C09K 2211/1011* (2013.01); *C09K 2211/1051* (2013.01); *Y02E 10/549* (2013.01); *H01L 51/5012* (2013.01); *C09K 2211/1029* (2013.01); *C09K 2211/1059* (2013.01); *Y10S 428/917* (2013.01)
USPC .......... 544/180; 546/38; 546/42; 546/49; 548/126; 548/310.7; 548/418; 549/41; 549/382; 564/308; 428/1.4; 428/690; 428/917; 313/483

(58) Field of Classification Search
None
See application file for complete search history.

(56) References Cited

U.S. PATENT DOCUMENTS

| | | |
|---|---|---|
| 8,748,010 B2 | 6/2014 | Heil et al. |
| 2009/0261717 A1 | 10/2009 | Buesing et al. |
| 2010/0013381 A1 | 1/2010 | Stoessel et al. |
| 2012/0172597 A1 | 7/2012 | Fortte et al. |

FOREIGN PATENT DOCUMENTS

| | | |
|---|---|---|
| DE | 10 2006 031990 A1 | 1/2008 |
| DE | 10 2006 035035 A1 | 1/2008 |
| JP | 01-271757 A | 10/1989 |
| JP | 3110873 A | 5/1991 |
| JP | 2000-327676 A | 11/2000 |
| JP | 2007227186 A | 9/2007 |
| WO | WO-2007/022845 A1 | 3/2007 |
| WO | WO-2011006568 A1 | 1/2011 |

OTHER PUBLICATIONS

Database CAPLUS on STN, Acc. No. 1957:52097, Nagai et al., JP 31002474 B (Apr. 4, 1956) (abstract).*
Database CAPLUS on STN, Acc. No. 1954:46234, Clar et al., Journal of the American Chemical Society (1953), 75, p. 2667-2672 (abstract).*
Database CAPLUS on STN, Acc. No. 1935:10931, Winterstein et al., Z. physiol. Chem. (1934), 230, p. 146-158 (abstract).*
Ruiz-Morales, Journal of Physical Chemistry (2004), 108(49), p. 10873-10896.*
Database CAPLUS on STN, Acc. No. 2000:830139, Matsuoka et al., JP 2000327676 A, Nov. 28, 2000, (abstract).*
Yu, Ming-Xin, et al., "Luminescence properties of aminobenzanthrones and their application as host emitters in organic light-emitting devices," Advanced Functional Materials, 2007, vol. 17, pp. 369-378.
Rule, H.G. and Smith. F.R., "Synthesis of mesobenzanthrones and anthanthrones by the Ullmann method," J. Chem. Soc. 1937, pp. 1096-1103.
Database: PubChem, Compound ID: 21087895, Dec. 5, 2007.
Scholl et al., Berichte der Deutschen Chemischen Gesellschaft, Abteilung B Abhandlungen, 1932, vol. 65B, pp. 902-915.
Larsen et al., "Snythesis, Structure, and Properties of Azatriangulenium Salts", Chemistry—A European Journal, 2001, vol. 7, No. 8, pp. 1773-1783.
Reznichenko et al., Khimiya Geterotsiklicheskikh Soedinenii, 1980, vol. 4, pp. 519-523.

* cited by examiner

*Primary Examiner* — Brian J Davis
(74) *Attorney, Agent, or Firm* — Drinker Biddle & Reath LLP

(57) ABSTRACT

The present invention relates to condensed aromatic compounds with multiple ring bridging of the general formulae (1), (2), (3), (4) and (5). The invention furthermore relates to the use of the compounds according to the invention in an organic electronic device and to a process for the preparation of the compounds according to the invention. The invention furthermore relates to an electronic device which comprises the compounds according to the invention.

18 Claims, No Drawings

MATERIALS FOR ORGANIC ELECTROLUMINESCENCE DEVICES

CROSS-REFERENCE TO RELATED APPLICATIONS

This application is a national stage application (under 35 U.S.C. §371) of PCT/EP2009/007046, filed Oct. 1, 2009, which claims benefit of German application 10 2008 054 141.9, filed Oct. 31, 2008.

BACKGROUND OF THE INVENTION

The present invention relates to condensed aromatic compounds with multiple ring bridging of the general formulae (1), (2), (3), (4) and (5). The invention furthermore relates to the use of the compounds according to the invention in an organic electronic device and to a process for the preparation of the compounds according to the invention. The invention furthermore relates to an electronic device which comprises the compounds according to the invention.

Organic semiconductors are being developed for a number of applications of different types which can be ascribed to the electronics industry in the broadest sense. The structure of organic electroluminescent devices (OLEDs) in which these organic semiconductors are employed as functional materials is described, for example, in U.S. Pat. No. 4,539,507, U.S. Pat. No. 5,151,629, EP 0676461 and WO 98/27136. However, there is still a need for improvement in these devices:

1. In systems in accordance with the prior art, one or more dopants are usually used in a host material in the emitting layer. It would be sensible to have compounds which can be used as pure substance in the emitting layer since this represents a technical simplification in device manufacture.
2. There is still a need for improvement in the lifetime of the organic electroluminescent device in order to employ this for long-lifetime high-quality applications.
3. The thermal stability of many organic compounds which are currently used in organic electroluminescent devices is unsatisfactory, meaning that considerable problems arise both in purification of the material by mass sublimation and in the application of the material by thermal evaporation. This applies, in particular, to compounds which contain styrylamino groups, as are frequently used as blue-emitting compounds.
4. There is also still a need for improvement in the efficiency and operating voltage.

For fluorescent OLEDs, the host materials used in accordance with the prior art are, in particular, condensed aromatic compounds, in particular anthracene or pyrene derivatives, especially for blue-emitting electro-luminescent devices, for example 9, 10-bis(2-naphthyl)anthracene (U.S. Pat. No. 5,935,721). Further anthracene derivatives are disclosed in WO 01/076323, in WO 01/021729, in WO 04/013073, in WO 04/018588, in WO 03/087023 or in WO 04/018587. Host materials based on aryl-substituted pyrenes and chrysenes are disclosed in WO 04/016575. For high-quality applications, it is desirable to have improved host materials available.

Prior art which may be mentioned in the case of blue-emitting compounds is the use of arylvinylamines (for example WO 04/013073, WO 04/016575, WO 04/018587). However, these compounds are thermally unstable and cannot be evaporated without decomposition, which requires high technical complexity for the synthesis and OLED manufacture and thus represents an industrial disadvantage. A further disadvantage is the emission colour of these compounds: whereas dark-blue emission (CIE y coordinates in the range 0.15-0.18) is described in the prior art using these compounds, it has not been possible to reproduce these colour coordinates in simple devices in accordance with the prior art. On the contrary, green-blue emission is obtained here. For high-quality applications, it is therefore necessary to have available improved emitters, particularly with respect to device and sublimation stability and emission colour. The electron-transport compound used in organic electroluminescent devices is usually $AlQ_3$ (aluminium trishydroxyquinolinate) (U.S. Pat. No. 4,539,507). This has a number of disadvantages: it cannot be applied by vapour deposition without leaving a residue since it partially decomposes at the sublimation temperature, which represents a major problem, in particular, for production plants. A further disadvantage is the strong hygroscopicity of $AlQ_3$, as is the low electron mobility, which results in higher voltages and thus in lower power efficiency. In order to avoid short circuits in the display, it would be desirable to increase the layer thickness; this is not possible with $AlQ_3$ owing to the low charge-carrier mobility and the resultant increase in voltage. Furthermore, the inherent colour of $AlQ_3$ (yellow in the solid), which can result in colour shifts, in particular in blue OLEDs, due to reabsorption and weak re-emission, proves to be very unfavourable. It is only possible to produce blue OLEDs here with considerable losses in efficiency and colour location. In spite of the said disadvantages, $AlQ_3$ still represents the best compromise to date for the wide variety of requirements of an electron-transport material in OLEDs.

Thus, there continues to be a demand for improved materials, in particular host materials for fluorescent emitters and triplet emitters, but also emitting compounds, in particular blue-emitting compounds, hole-transport materials and electron-transport materials, which are thermally stable, result in good efficiencies and at the same time in long lifetimes in organic electronic devices, give reproducible results during manufacture and operation of the device, are accessible synthetically simply and in high yields and have high thermal stability.

BRIEF SUMMARY OF THE INVENTION

The object of the present invention thus consists in the provision of such compounds.

Surprisingly, it has been found that double-bridged aromatic systems of the formulae (1) to (5) below are, owing to excellent properties, very highly suitable as functional materials for use in organic electroluminescent devices since they only exhibit a small difference between the excitation and emission wavelength (Stokes shift). Functional materials known from the prior art frequently carry flexible units, such as olefinic double bonds, which increase the number of degrees of rotational freedom and thus increase the Stokes shift. In addition, the rigid units in the compounds according to the invention ensure high thermal stability and a high glass transition temperature and can thus be sublimed without decomposition. A high glass transition temperature is essential for achieving long lifetimes, in particular for use at elevated temperature.

To this end, the invention provides compounds of the general formula (1), (2), (3), (4) or (5):

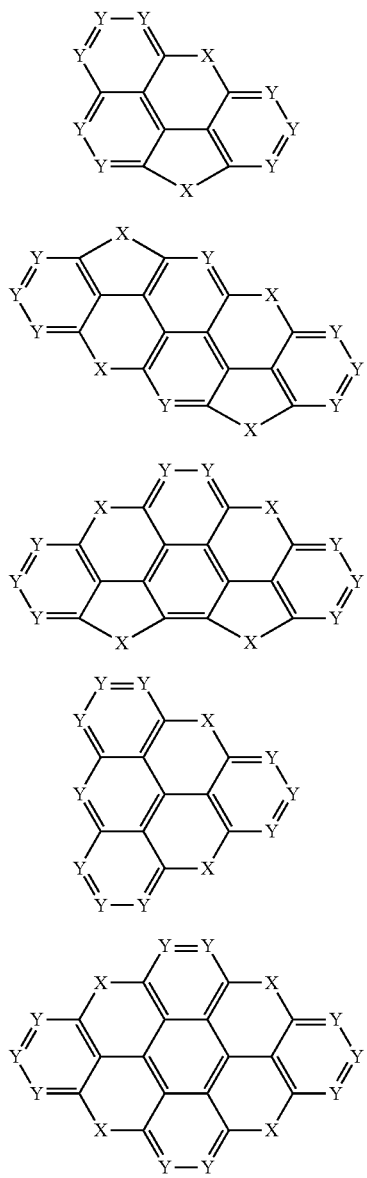

formula (1)

formula (2)

formula (3)

formula (4)

formula (5)

where:
X is in each case, independently of one another, a divalent bridge selected from $B(R^1)$, $C(R^1)_2$, $Si(R^1)_2$, $C=NR^1$, $C=C(R^1)_2$, O, S, C=O, S=O, $SO_2$, $N(R^1)$, $P(R^1)$ and $P(=O)R^1$;

Y is in each case, independently of one another, CR or N;

R is in each case, independently of one another, H, D, F, Cl, Br, I, $N(R^2)_2$, $N(Ar)_2$, C(=O)Ar, $P(=O)Ar_2$, S(=O)Ar, $S(=O)_2Ar$, $CR^2=CR^2Ar$, CN, $NO_2$, $Si(R^2)_3$, $B(OR^2)_2$, $OSO_2R^2$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals $R^2$, where one or more non-adjacent $CH_2$ groups may be replaced by $R^2C=CR^2$, C≡C, $Si(R^2)_2$, $Ge(R^2)_2$, $Sn(R^2)_2$, C=O, C=S, C=Se, $C=NR^2$, $P(=O)(R^2)$, SO, $SO_2$, $NR^2$, O, S or $CONR^2$ and where one or more H atoms may be replaced by D, F, Cl, Br, I, CN or $NO_2$, or an aromatic or heteroaromatic ring system having 5 to 40 aromatic ring atoms, which may in each case be substituted by one or more non-aromatic radicals R, or an aryloxy or heteroaryloxy group having 5 to 40 aromatic ring atoms, which may be substituted by one or more non-aromatic radicals R, or a combination of these systems; where two or more radicals R may form a mono- or polycyclic, aliphatic or aromatic ring system;

$R^1$ is in each case, independently of one another, H, D, F, Cl, Br, I, CN, $NO_2$, $B(OR^2)_2$, $Si(R^2)_3$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals $R^2$, where one or more non-adjacent $CH_2$ groups may be replaced by $-R^2C=CR^2-$, $-C≡C-$, $Si(R^2)_2$, $Ge(R^2)_2$, $Sn(R^2)_2$, C=O, C=S, C=Se, $C=NR^2$, $-O-$, $-S-$, $-COO-$ or $-CONR^2-$ and where one or more H atoms may be replaced by D, F, Cl, Br, I, CN or $NO_2$, or an arylamine or a substituted carbazole, each of which may be substituted by one or more radicals $R^2$, or an aromatic or heteroaromatic ring system having 5 to 40 aromatic ring atoms, which may be substituted by one or more non-aromatic radicals $R^1$, or an aryloxy or heteroaryloxy group having 5 to 40 aromatic ring atoms, which may be substituted by one or more non-aromatic radicals $R^1$, or a combination of these systems; where two or more substituents $R^1$ may also form a mono- or polycyclic, aliphatic or aromatic ring system with one another;

$R^2$ is in each case, independently of one another, H, D or an aliphatic or aromatic hydrocarbon radical having 1 to 20 C atoms;

Ar is in each case, independently of one another, an aromatic or hetero-aromatic ring system having 5 to 40 aromatic ring atoms, which may be substituted by one or more non-aromatic radicals $R^1$; two groups Ar here which are bonded to the same atom may also be connected to one another by a single bond or a divalent group $C(R)_2$.

The following compounds are known from the prior art (Journal of the Chemical Society (1937), 1096-1103):

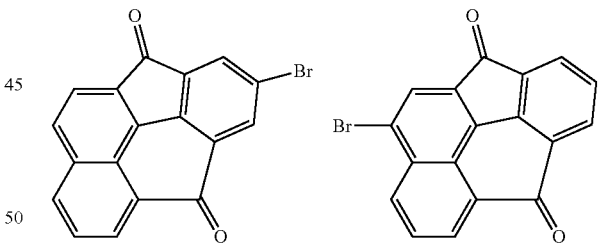

These compounds can also be used for the purposes of the invention, but are excluded from the product protection for the purposes of this invention.

If the radicals defined above occur a number of times within a compound, the radicals may, independently of one another, be identical or different on each occurrence, corresponding to the respective definition.

DETAILED DESCRIPTION OF THE INVENTION

The following general definitions are furthermore used within this invention:

For the purposes of this invention, an aryl group contains 5 to 60 C atoms; for the purposes of this invention, a heteroaryl group contains 2 to 60 C atoms and at least one heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, phenanthrene, quinoline, isoquinoline, benzothiophene, benzofuran and indole, etc. Of these, naphthalene and quinoline are particularly preferred.

For the purposes of this invention, the radical Ar in the general formulae (1) to (5) is particularly preferably benzene, biphenyl, naphthalene, pyridine, pyrimidine, pyrazine, pyridazine, triazine, quinoline, isoquinoline, furan, thiophene, pyrrole, benzofuran, benzothiophene and indole, where benzene, naphthalene, pyridine, quinoline and isoquinoline are most preferred.

For the purposes of this invention, an aromatic ring system contains 5 to 60 C atoms in the ring system. For the purposes of this invention, a heteroaromatic ring system contains 2 to 60 C atoms and at least one heteroatom in the ring system, with the proviso that the sum of C atoms and heteroatoms is at least 5. The heteroatoms are preferably selected from N, O and/or S. For the purposes of this invention, an aromatic or heteroaromatic ring system is intended to be taken to mean a system which does not necessarily contain only aryl or heteroaryl groups, but instead in which a plurality of aryl or heteroaryl groups may also be interrupted by a non-aromatic unit (preferably less than 10% of the atoms other than H), such as, for example, an $sp^3$-hybridised C, N or O atom. Thus, for example, systems such as 9,9'-spirobifluorene, 9,9-diarylfluorene, triarylamine, diarylether, stilbene, etc. are also intended to be taken to be aromatic ring systems for the purposes of this invention, as are systems in which two or more aryl groups are interrupted, for example, by a linear or cyclic alkyl group or by a silyl group.

For the purposes of the present invention, a $C_1$- to $C_{40}$-alkyl group, in which, in addition, individual H atoms or $CH_2$ groups may be substituted by the above-mentioned groups, is preferably taken to mean the radicals methyl, ethyl, n-propyl, i-propyl, n-butyl, i-butyl, s-butyl, t-butyl, 2-methyl-butyl, n-pentyl, s-pentyl, cyclopentyl, n-hexyl, cyclohexyl, n-heptyl, cyclo-heptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl. A $C_1$- to $C_{40}$-alkoxy group is preferably taken to mean methoxy, trifluoromethoxy, ethoxy, n-propoxy, i-propoxy, n-butoxy, i-butoxy, s-butoxy, t-butoxy or 2-methyl-butoxy.

An aromatic or heteroaromatic ring system having 5-60 aromatic ring atoms, which may also in each case be substituted by the above-mentioned radicals R and which may be linked to the aromatic or heteroaromatic ring system via any desired positions, is taken to mean, in particular, groups derived from benzene, naphthalene, anthracene, benzanthracene, phenanthrene, pyrene, chrysene, perylene, fluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

In a preferred embodiment of the invention, the group X is selected, identically or differently on each occurrence, from $C(R^1)_2$, $NR^1$, O, S or C=O. The group X is particularly preferably, identically or differently on each occurrence, $C(R)_2$.

In a further preferred embodiment of the invention, 0, 1 or 2 symbols Y in the formulae (1) to (5) stand for N and the other symbols Y stand, identically or differently on each occurrence, for CR. Particularly preferably, all symbols Y stand, identically or differently on each occurrence, for CR.

In a further preferred embodiment of the invention, the symbol R stands, identically or differently on each occurrence, for H, D, F, $N(Ar)_2$, CN, a straight-chain alkyl or alkoxy group having 1 to 20 C atoms or a branched or cyclic alkyl or alkoxy group having 3 to 40 C atoms, each of which may be substituted by one or more radicals $R^2$, where one or more H atoms may be replaced by F, or an aromatic or heteroaromatic ring system having 5 to 25 aromatic ring atoms, which may in each case be substituted by one or more non-aromatic radicals R, or a combination of these systems; where two or more radicals R may form a mono- or polycyclic, aliphatic or aromatic ring system. The symbol R particularly preferably stands, identically or differently on each occurrence, for H, $N(Ar)_2$, a straight-chain alkyl group having 1 to 10 C atoms or a branched or cyclic alkyl group having 3 to 40 C atoms, in particular a methyl group, or an aromatic or heteroaromatic ring system having 5 to 25 aromatic ring atoms, which may in each case be substituted by one or more non-aromatic radicals R; where two or more radicals R may form a mono- or polycyclic, aliphatic or aromatic ring system.

In a further preferred embodiment of the invention, the symbol $R^1$ stands, identically or differently on each occurrence, for H, D, a straight-chain alkyl or alkoxy group having 1 to 20 C atoms or a branched or cyclic alkyl or alkoxy group having 3 to 20 C atoms, each of which may be substituted by one or more radicals $R^2$, where one or more H atoms may be replaced by F, or an aromatic or heteroaromatic ring system having 5 to 25 aromatic ring atoms, which may be substituted by one or more non-aromatic radicals $R^1$, or a combination of these systems; where two or more substituents $R^1$ may also form a mono- or polycyclic, aliphatic or aromatic ring system with one another. In a particularly preferred embodiment, the symbol $R^1$ stands, identically or differently on each occurrence, for H, D, a straight-chain alkyl group having 1 to 10 C atoms or a branched or cyclic alkyl group having 3 to 10 C atoms, in particular a methyl group, or an aromatic or heteroaromatic ring system having 5 to 10 aromatic ring atoms, which may be substituted by one or more non-aromatic radicals $R^1$, in particular a phenyl group, which may be substituted by one or more non-aromatic radicals $R^1$; where two or more substituents $R^1$ may also form a mono- or polycyclic, aliphatic or aromatic ring system with one another.

In a preferred embodiment of the invention, the following applies to the compounds of the general formulae (1), (2), (3), (4) and (5):

X is in each case, independently of one another, a divalent bridge selected from $C(R^1)_2$, $C=NR^1$, $C=C(R^1)_2$, O, S, C=O and $N(R^1)$;

Y is in each case, independently of one another, CR or N;

R is in each case, independently of one another, H, D, F, $N(Ar)_2$, C(=O)Ar, $CR^2=CR^2Ar$, CN, a straight-chain alkyl, alkoxy or thioalkoxy group having 1 to 10 C atoms or a branched or cyclic alkyl, alkoxy or thioalkoxy group having 3 to 10 C atoms, each of which may be substituted by one or more radicals $R^2$, where one or more non-adjacent $CH_2$ groups may be replaced by $R^2C=CR^2$, C≡C, C=O, $NR^2$, O, S or $CONR^2$ and where one or more H atoms may be replaced by D, F or CN, or an aromatic or heteroaromatic ring system having 5 to 40 aromatic ring atoms, which may in each case be substituted by one or more radicals $R^2$, or an aryloxy or heteroaryloxy group having 5 to 40 aromatic ring atoms, which may be substituted by one or more radicals $R^2$, or a combination of these systems; where two or more radicals R or two or more radicals R' may form a mono- or polycyclic aliphatic or aromatic ring system;

$R^1$ is in each case, independently of one another, H, D, F, Cl, Br, I, CN, $NO_2$, $B(OR^2)_2$, $Si(R^2)_3$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals $R^2$, where one or more non-adjacent $CH_2$ groups may be replaced by —$R^2C=CR^2$—, —C≡C—, $Si(R^2)_2$, $Ge(R^2)_2$, $Sn(R^2)_2$, C=O, C=S, C=Se, $C=NR^2$, —O—, —S—, —COO— or —$CONR^2$— and where one or more H atoms may be replaced by D, F, Cl, Br, I, CN or $NO_2$, or arylamines, or substituted carbazoles, which may in each case be substituted by one or more radicals $R^2$, or an aromatic or heteroaromatic ring system having 5 to 40 aromatic ring atoms, which may be substituted by one or more non-aromatic radicals $R^1$, or an aryloxy or heteroaryloxy group having 5 to 40 aromatic ring atoms, which may be substituted by one or more non-aromatic radicals $R^1$, or a combination of these systems, where two or more substituents $R^1$ may also form a mono- or polycyclic, aliphatic or aromatic ring system with one another;

$R^2$ is in each case, independently of one another, H, D or an aliphatic or aromatic hydrocarbon radical having 1 to 10 C atoms;

Ar is in each case, independently of one another, an aromatic or heteroaromatic ring system having 5 to 20 aromatic ring atoms, which may be substituted by one or more non-aromatic radicals $R^1$; two groups Ar here which are bonded to the same atom may also be connected to one another by a single bond.

In a particularly preferred embodiment of the compounds of the formulae (1) to (5):

X is selected, identically or differently on each occurrence, from $C(R^1)_2$, $NR^1$, O, S or C=O, in particular $C(R^1)_2$;

Y is, identically or differently on each occurrence, $CR^1$ or N, where 0, 1 or 2 symbols Y in the formulae (1) to (5) stand for N, in particular, identically or differently on each occurrence, CR;

R is on each occurrence, identically or differently, H, D, F, $N(Ar)_2$, CN, a straight-chain alkyl or alkoxy group having 1 to 20 C atoms or a branched or cyclic alkyl or alkoxy group having 3 to 20 C atoms, each of which may be substituted by one or more radicals $R^2$, where one or more H atoms may be replaced by F, or an aromatic or heteroaromatic ring system having 5 to 25 aromatic ring atoms, which may in each case be substituted by one or more non-aromatic radicals R, or a combination of these systems; where two or more radicals R may form a mono- or polycyclic, aliphatic or aromatic ring system; particular preference is given to H, $N(Ar)_2$, a straight-chain alkyl group having 1 to 10 C atoms or a branched or cyclic alkyl group having 3 to 10 C atoms, in particular a methyl group, or an aromatic or heteroaromatic ring system having 5 to 25 aromatic ring atoms, which may in each case be substituted by one or more non-aromatic radicals R; where two or more radicals R may form a mono- or polycyclic, aliphatic or aromatic ring system;

$R^1$ is, identically or differently on each occurrence, H, D, a straight-chain alkyl or alkoxy group having 1 to 20 C atoms or a branched or cyclic alkyl or alkoxy group having 3 to 20 C atoms, each of which may be substituted by one or more radicals $R^2$, where one or more H atoms may be replaced by F, or an aromatic or heteroaromatic ring system having 5 to 25 aromatic ring atoms, which may be substituted by one or more non-aromatic radicals $R^1$, or a combination of these systems; where two or more substituents $R^1$ may also form a mono- or polycyclic, aliphatic or aromatic ring system with one another; particular preference is given to H, a straight-chain alkyl group having 1 to 10 C atoms or a branched or cyclic alkyl group having 3 to 10 C atoms, in particular a methyl group, or an aromatic or heteroaromatic ring system having 5 to 10 aromatic ring atoms, which may be substituted by one or more non-aromatic radicals $R^1$, in particular a phenyl group, which may be substituted by one or more non-aromatic radicals $R^1$; where two or more substituents $R^1$ may also form a mono- or polycyclic, aliphatic or aromatic ring system with one another;

the other symbols have the meaning mentioned above.

Preferred embodiments of the formulae (1) to (5) are the formulae (1a) to (5a) depicted below:

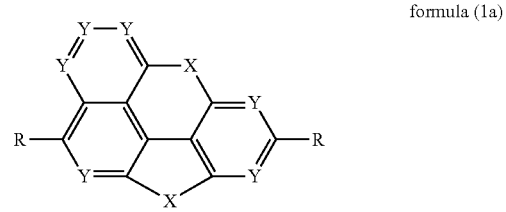

formula (1a)

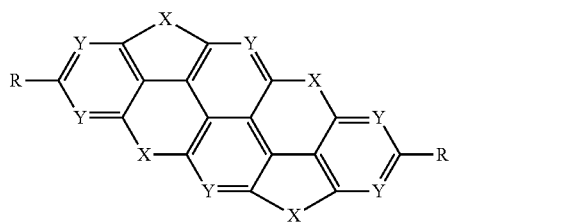

formula (2a)

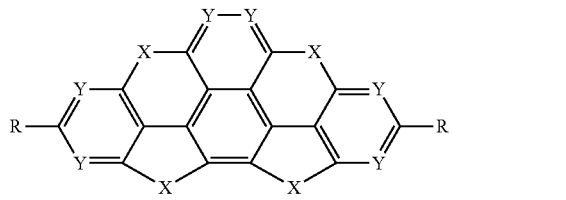

formula (3a)

-continued formula (4a)
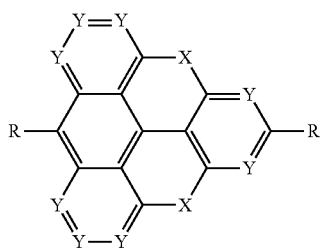

formula (3b)
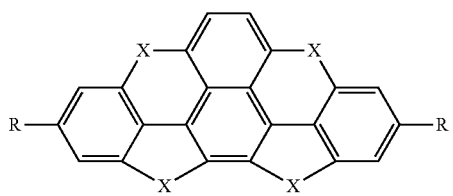

formula (5a)
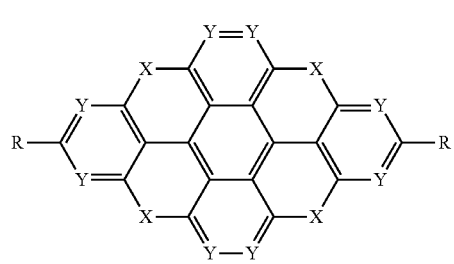

formula (4b)
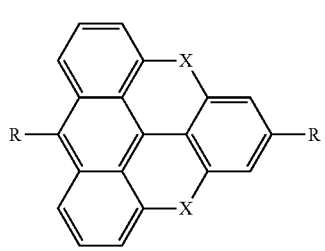

where the symbols used have the meanings mentioned above, and a maximum of two symbols Y in each structure stand for N. In particular, the symbols used have the preferred meanings mentioned above.

Particularly preferred embodiments of these compounds are the compounds (1b) to (5b) depicted below:

formula (1b)
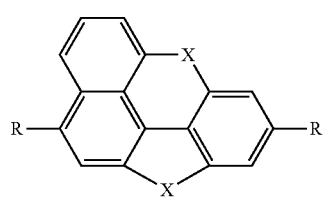

formula (5b)
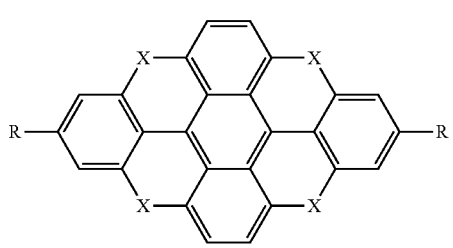

formula (2b)
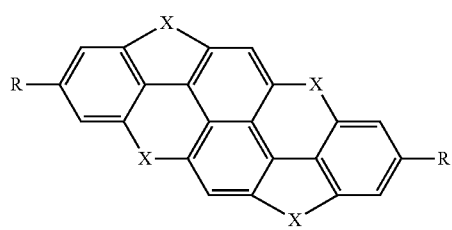

where R and X have the meanings mentioned above.

Very particular preference is given to compounds of the formulae (1b) to (5b) in which X stands, identically or differently on each occurrence, for $C(R^1)_2$, $NR^1$, O, S or C=O, in particular for $C(R^1)_2$, where $C(CH_3)_2$ or $C(phenyl)_2$ is particularly preferred.

In particularly preferred embodiments of the invention, the compounds of the general formula (1), (2), (3), (4) or (5) satisfy the following structural formulae I to 184:

1

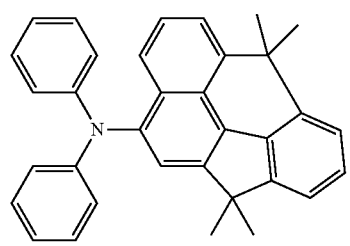

2

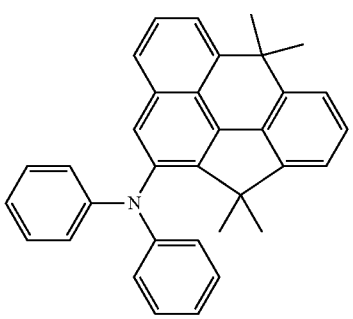

-continued
| 3 | 4 |
|---|---|
| 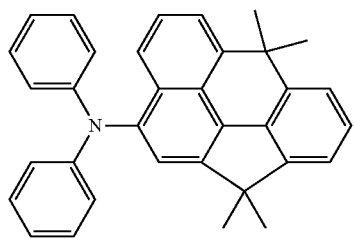 | 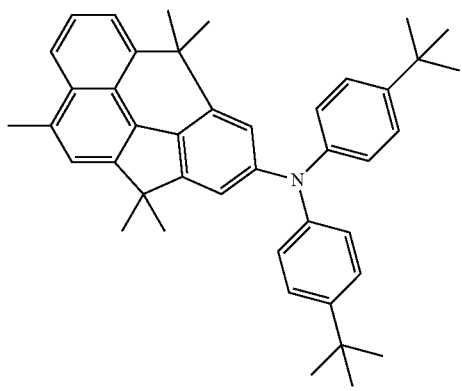 |
| 5 | 6 |
| 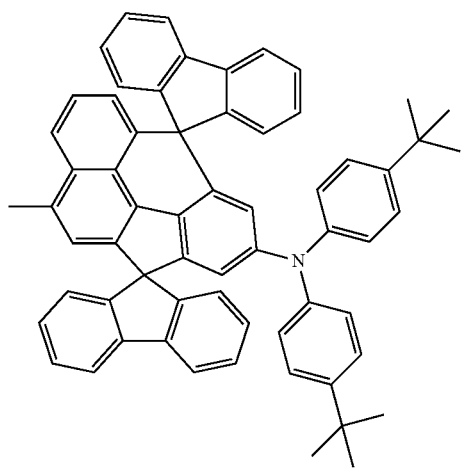 | 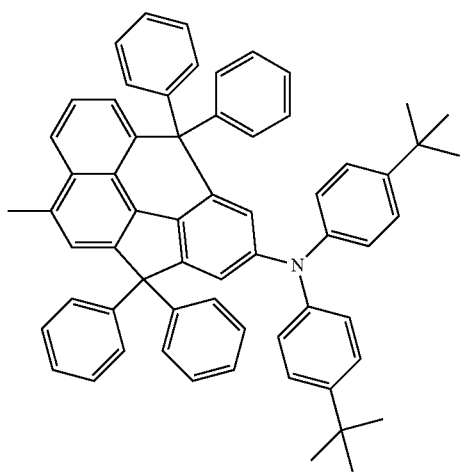 |
| 7 | 8 |
| 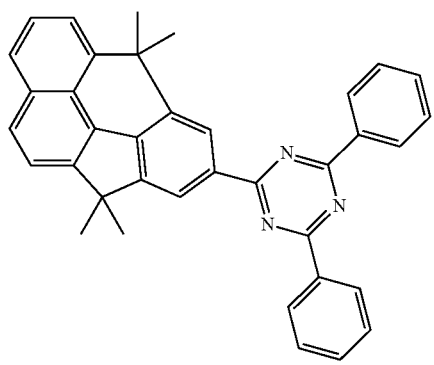 | 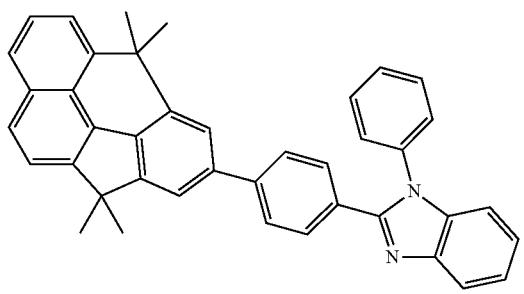 |
| 9 | 10 |
| 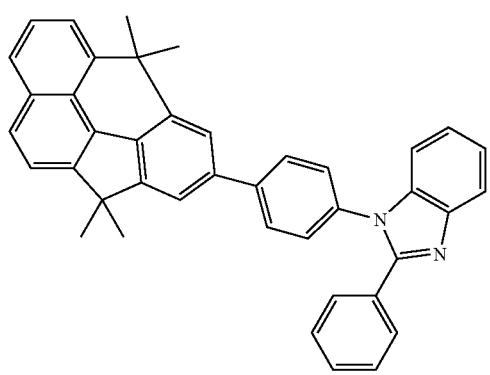 | 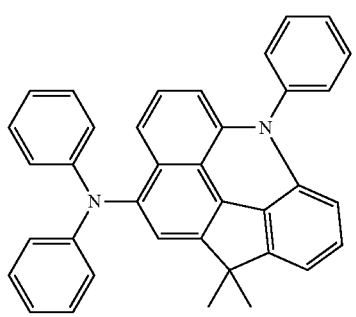 |

-continued
11
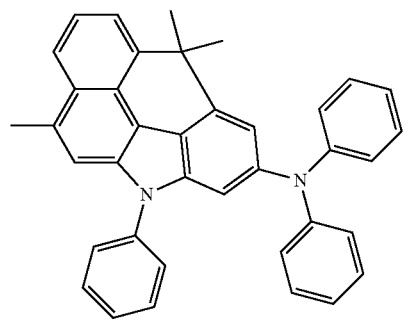
12
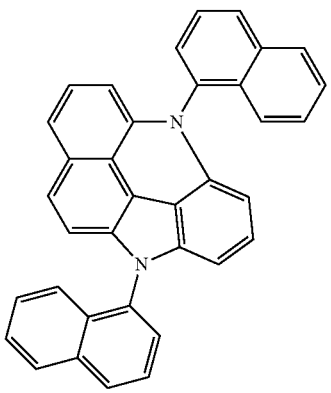
13
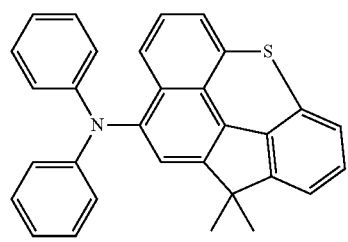
14
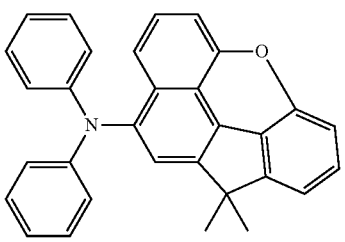
15
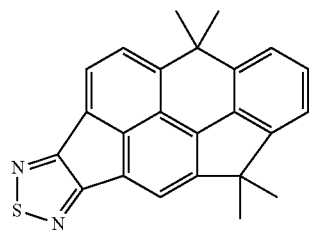
16
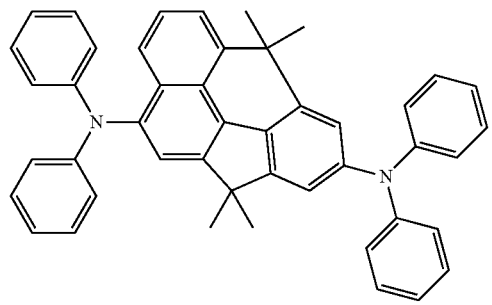
17
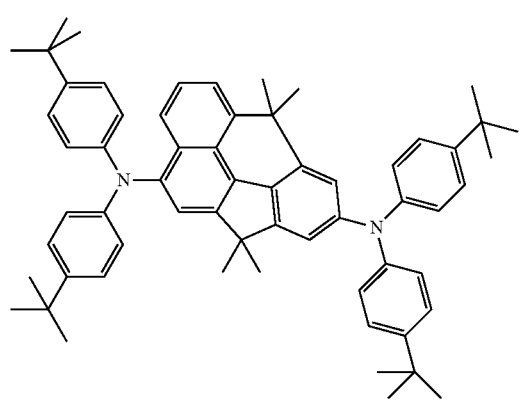
18
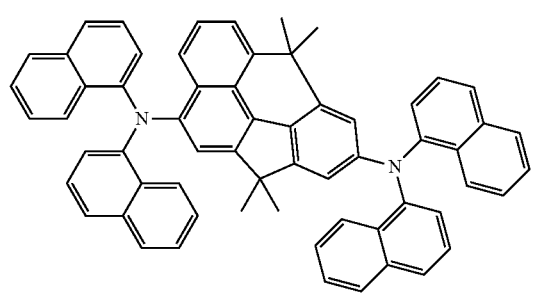
19
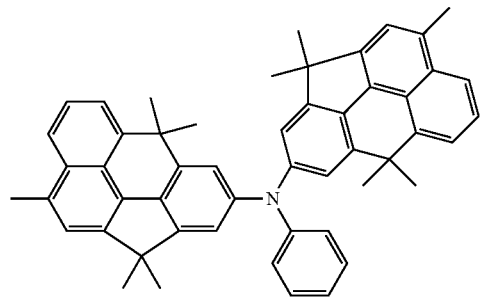
20
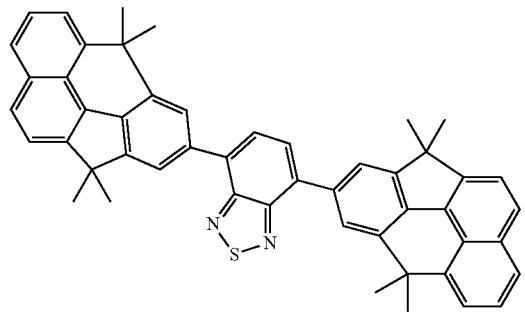

21
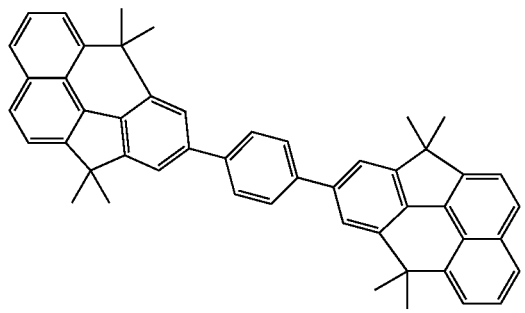
22
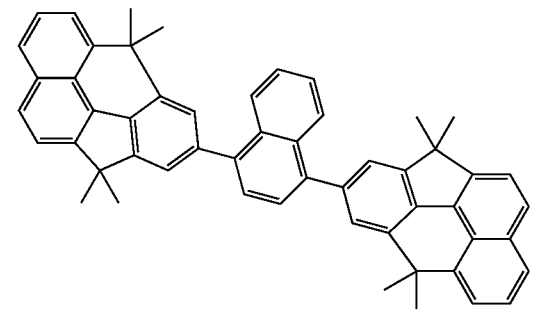
23
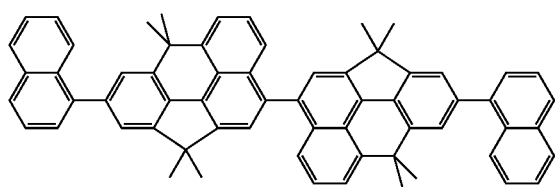
24
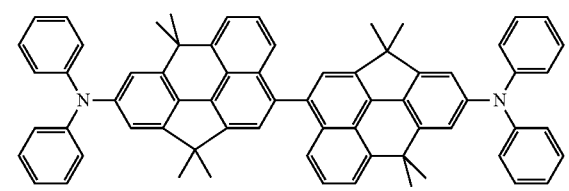
25
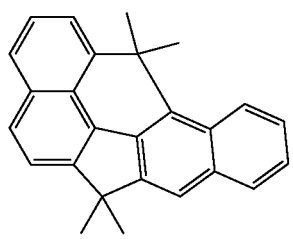
26
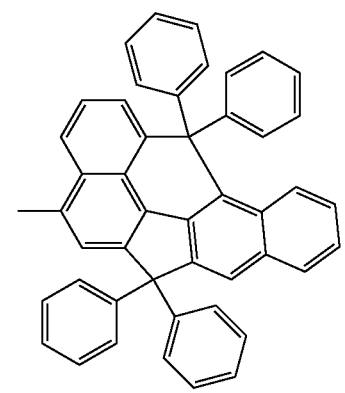
27
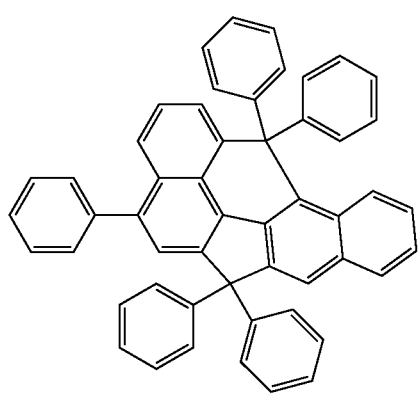
28
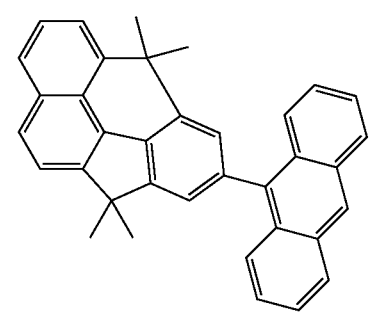
29
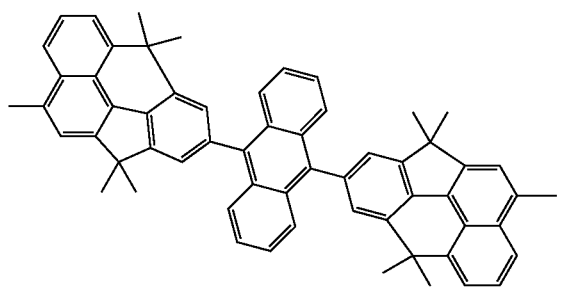
30
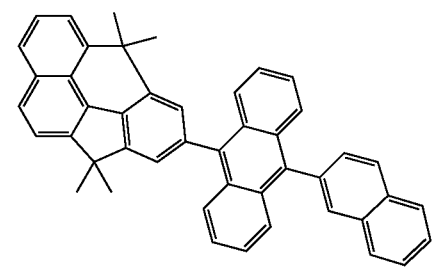

-continued
31
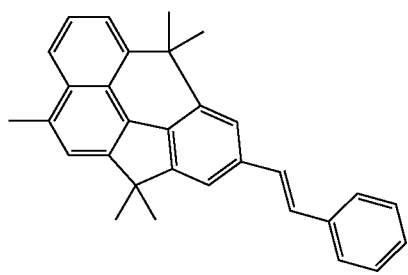
32
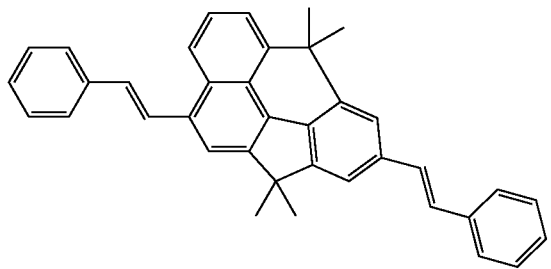
33
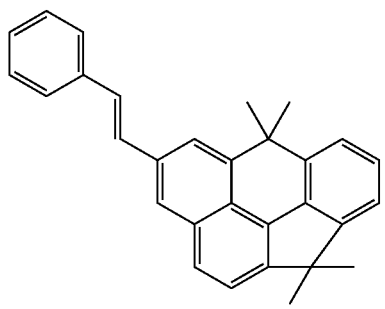
34
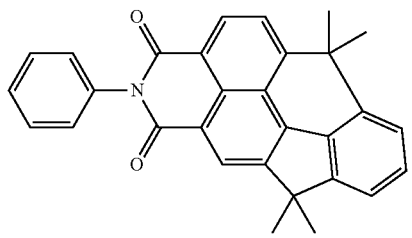
35
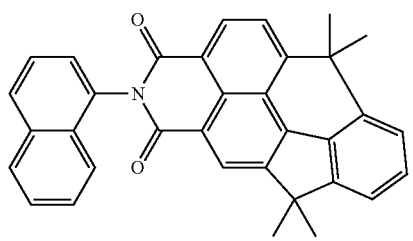
36
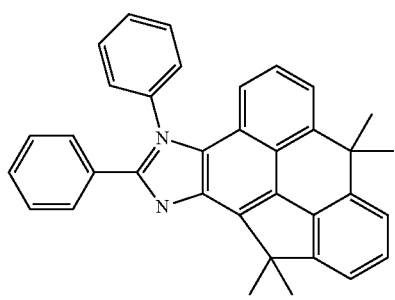
37
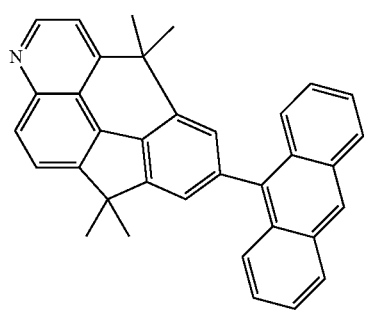
38
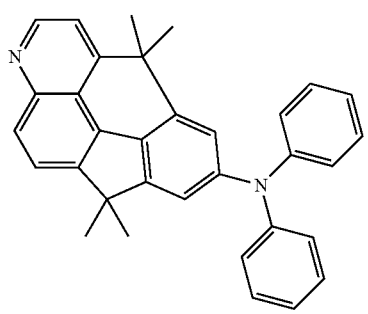
39
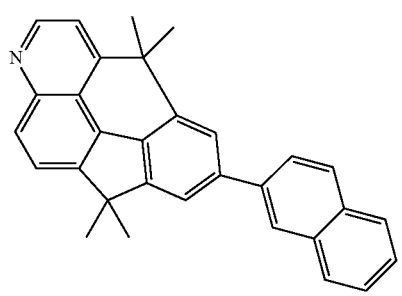
40
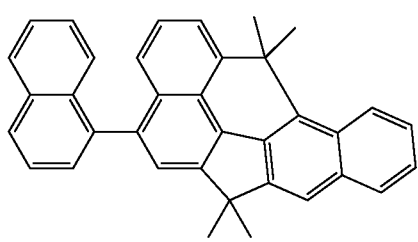

41
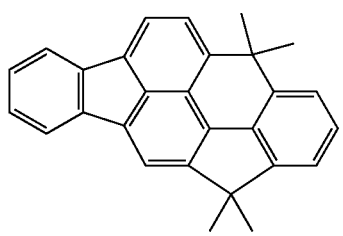
42
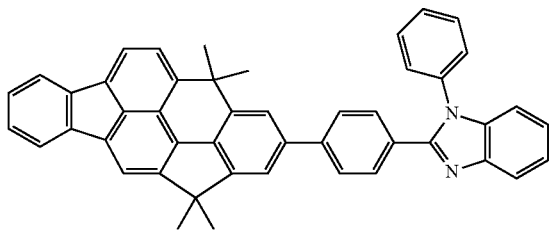
43
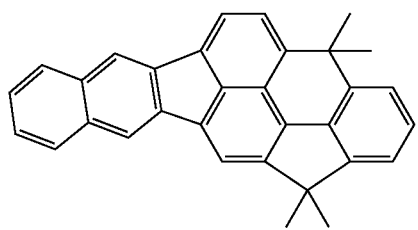
44
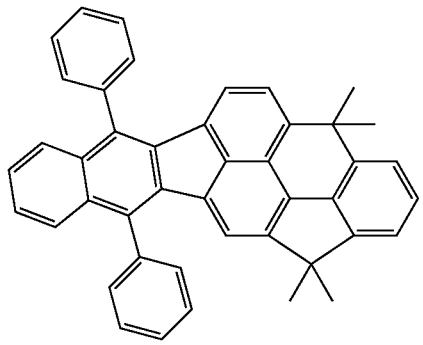
45
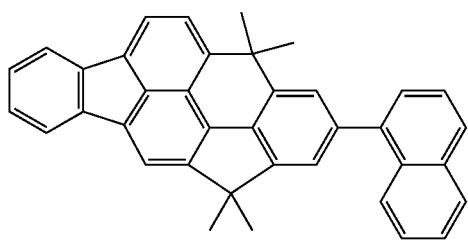
46
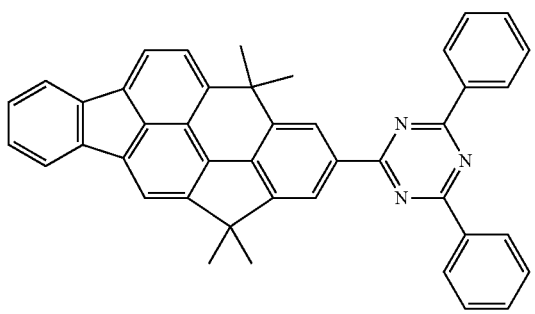
47
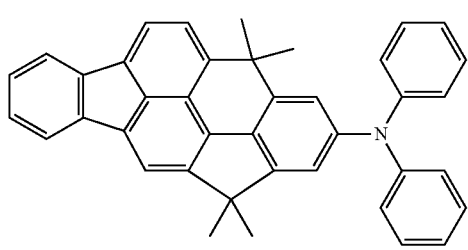
48
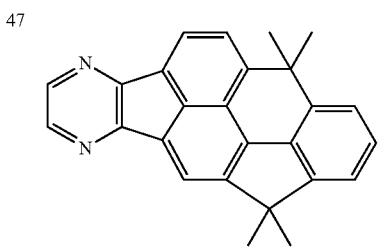
49
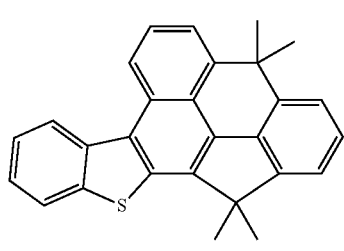
50
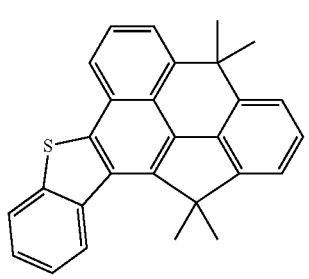

-continued
51
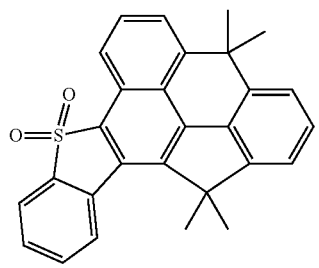
52
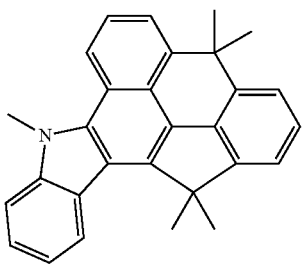
53
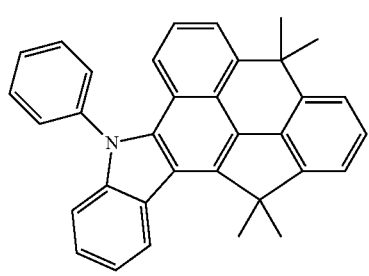
54
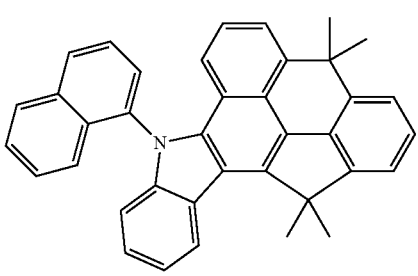
55
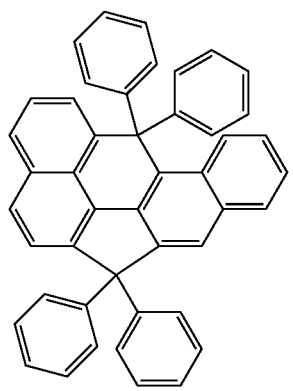
56
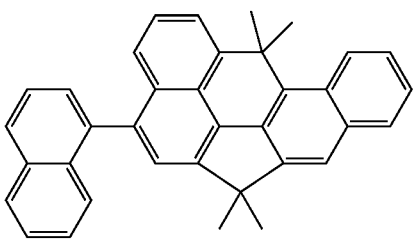
57
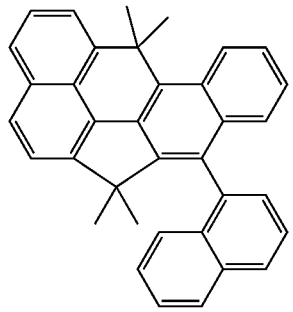
58
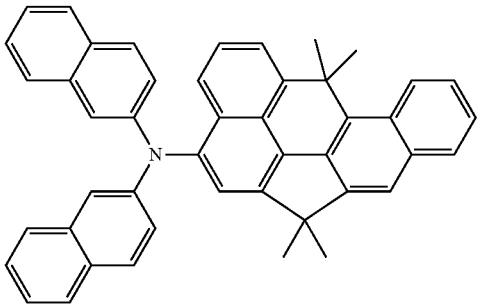
59
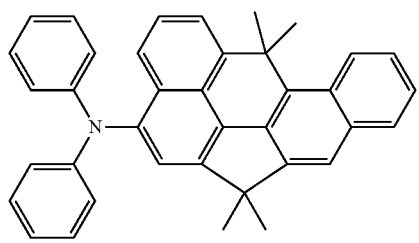
60
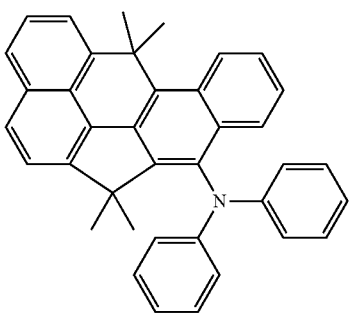

-continued
61
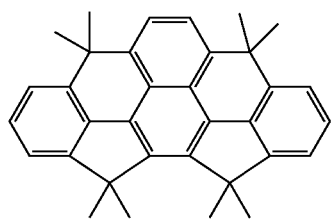
62
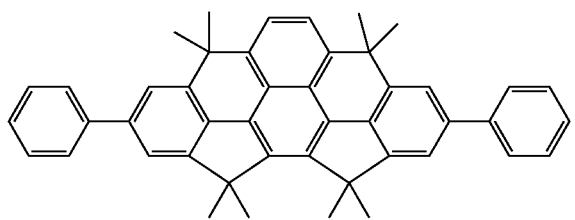
63
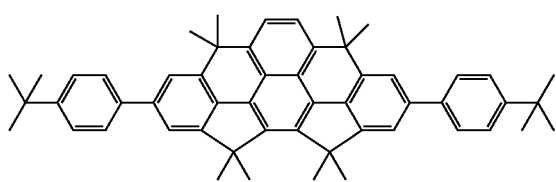
64
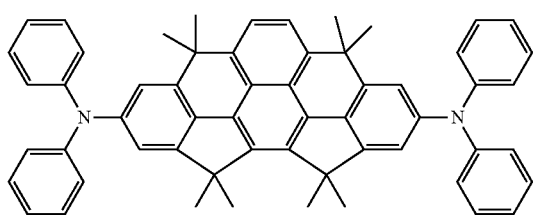
65
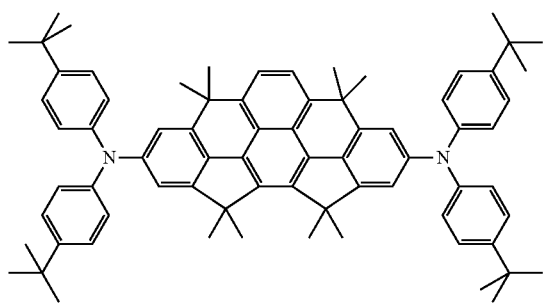
66
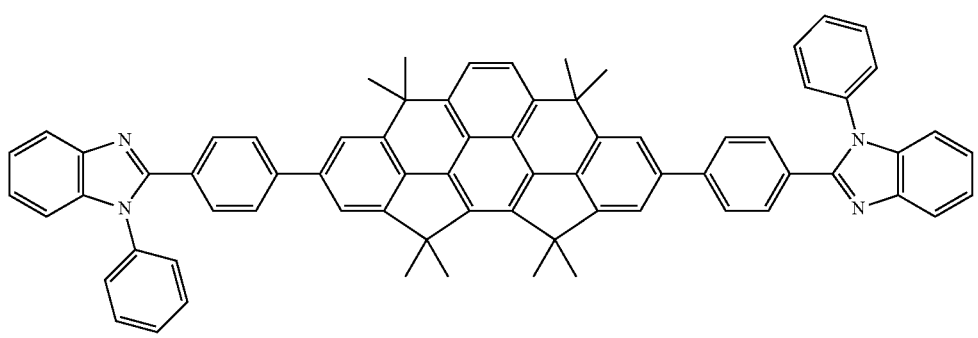
67
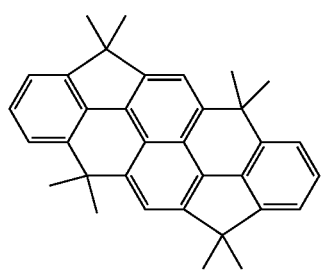
68
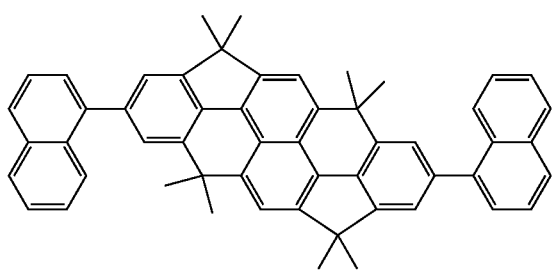

69
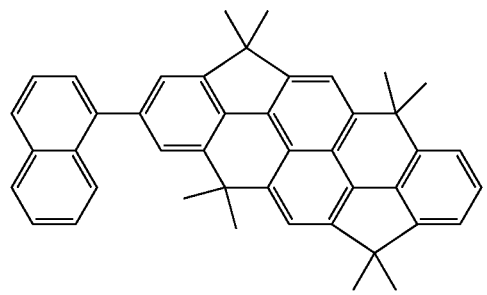
70
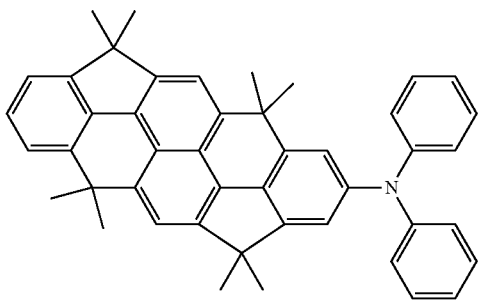
71
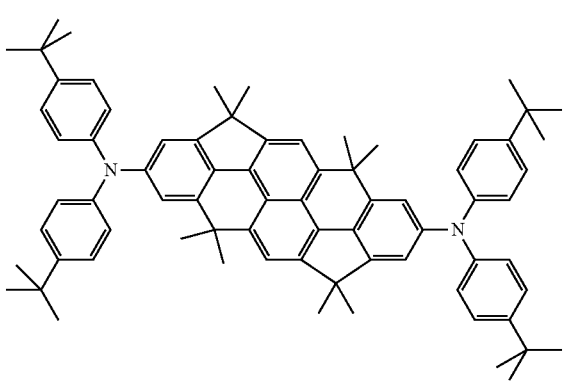
72
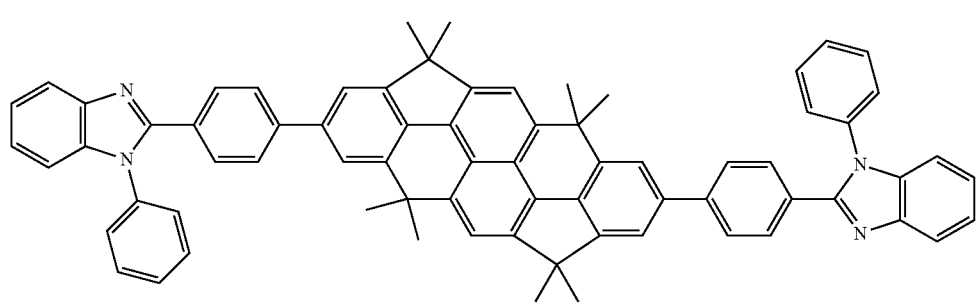
73
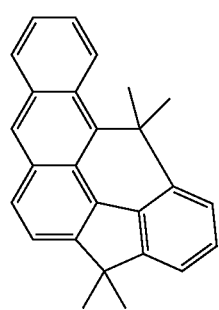
74
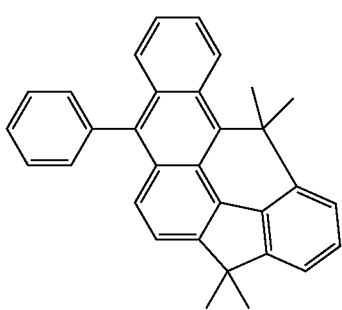

-continued
75
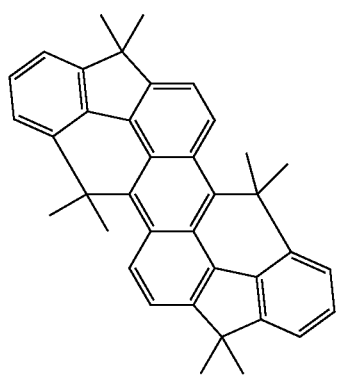
76
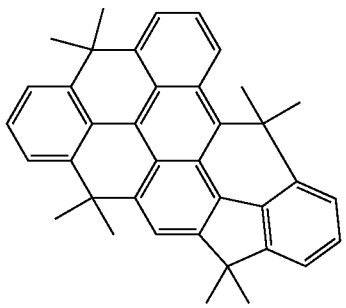
77
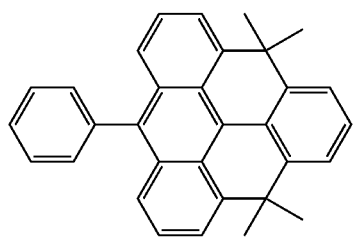
78
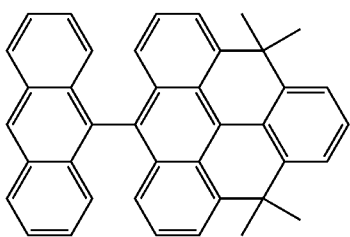
79
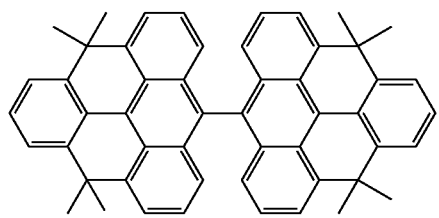
80
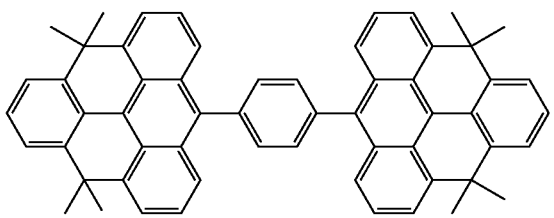
81
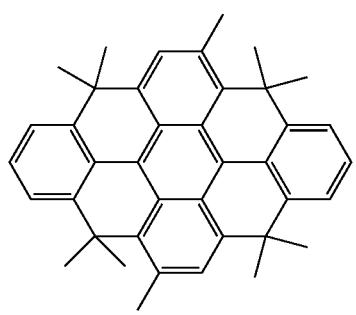
82
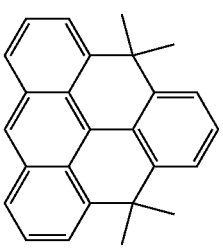
83
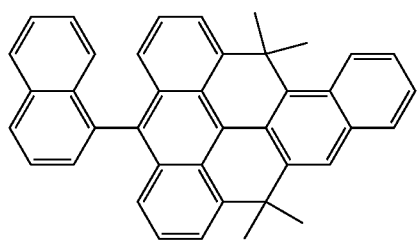
84
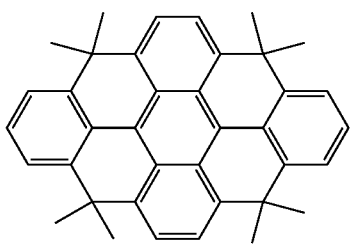

-continued
85
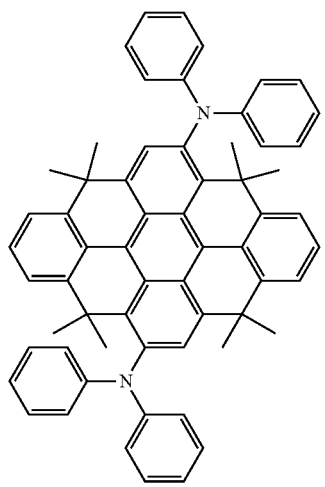
86
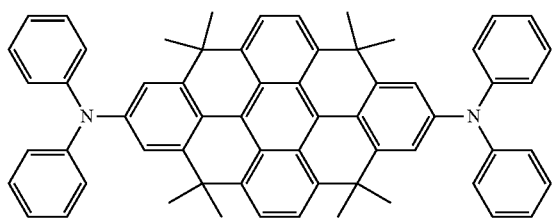
87
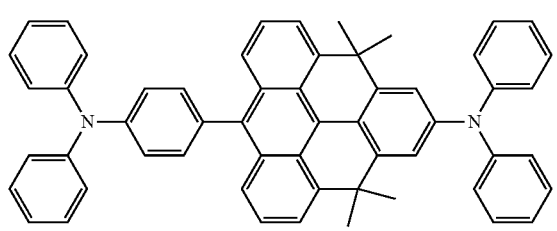
88
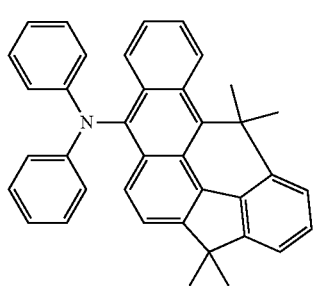
89
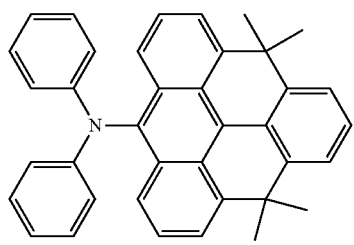
90
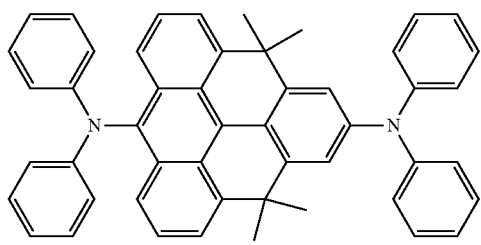
91
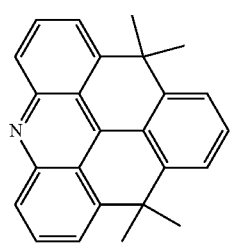
92
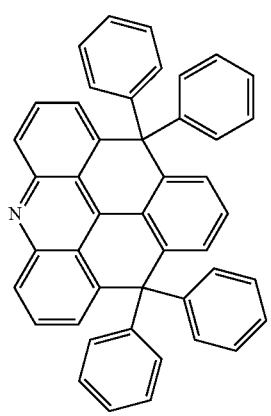

-continued
| | |
|---|---|
| 93 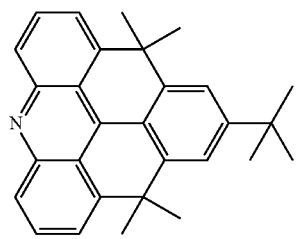 | 94 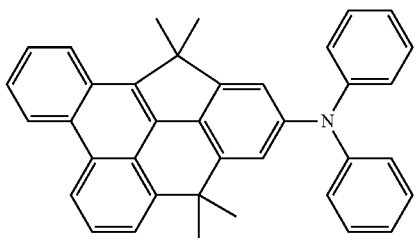 |
| 95 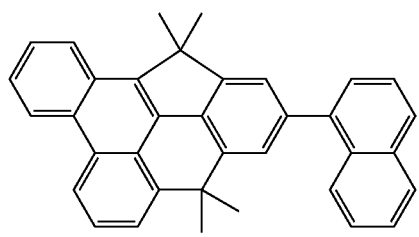 | 96 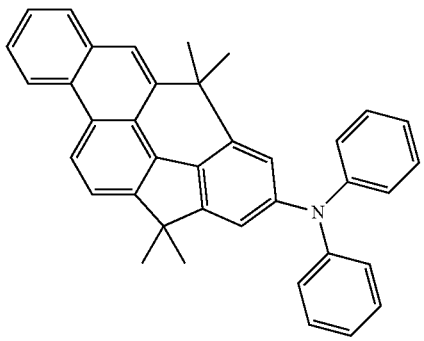 |
| 97 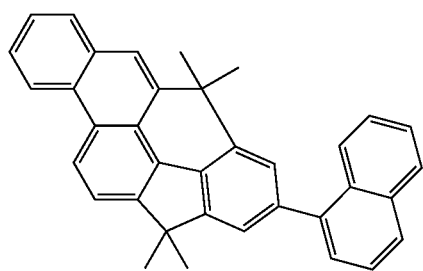 | 98 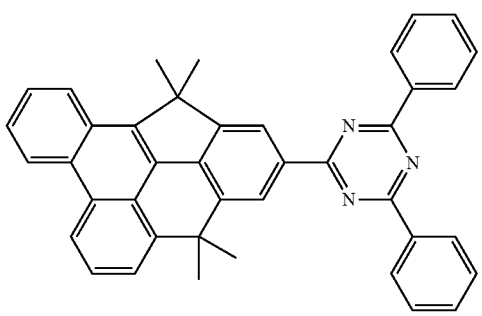 |
| 99 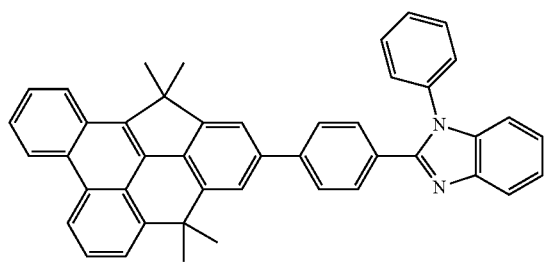 | 100 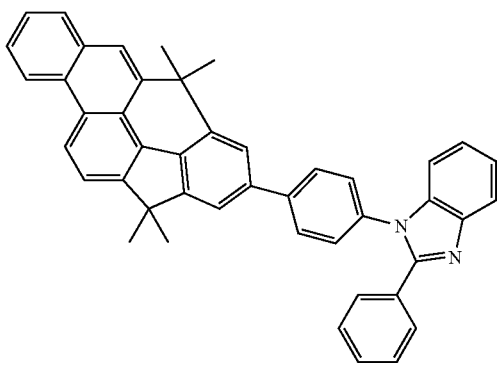 |
| 101 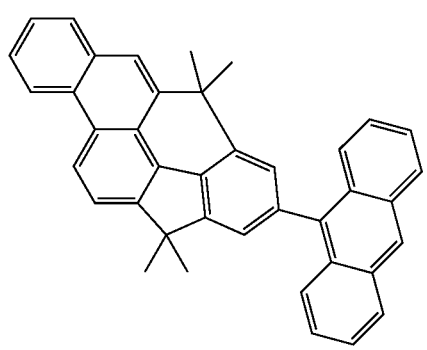 | 102 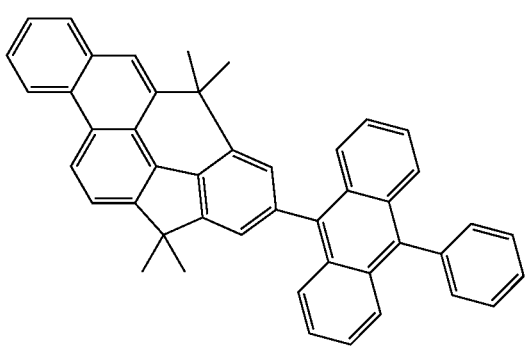 |

-continued
103
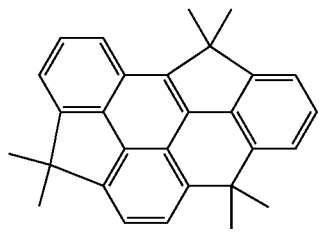
104
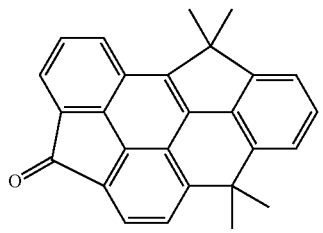
105
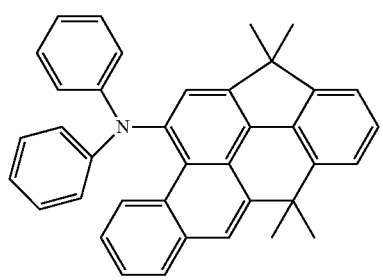
106
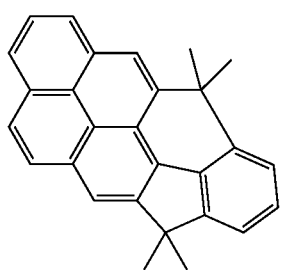
107
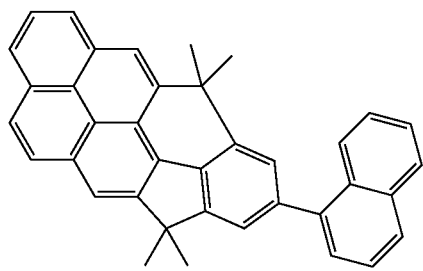
108
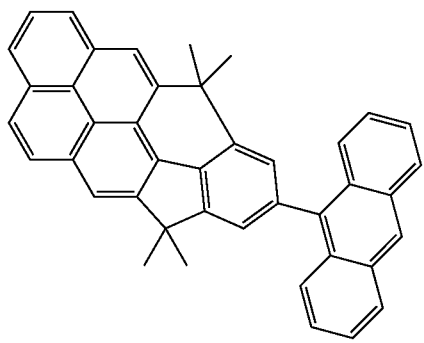
109
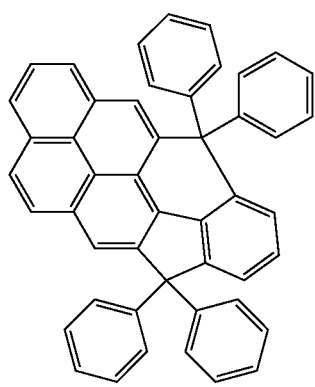
110
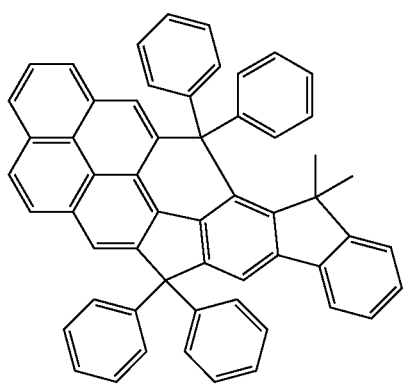

-continued
| | |
|---|---|
| 111 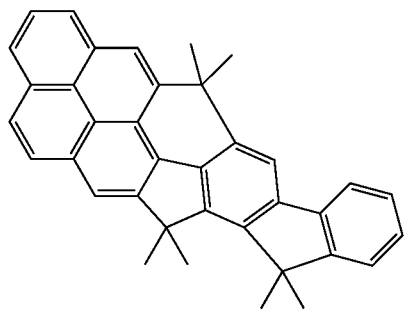 | 112 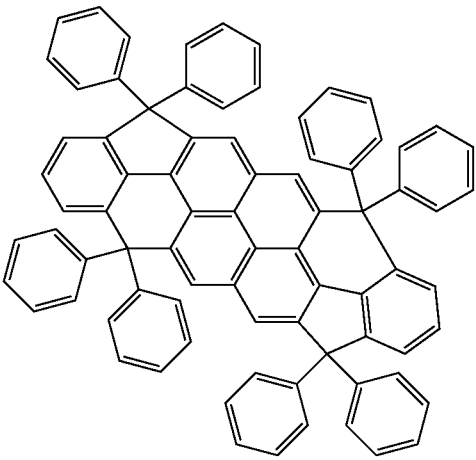 |
| 113 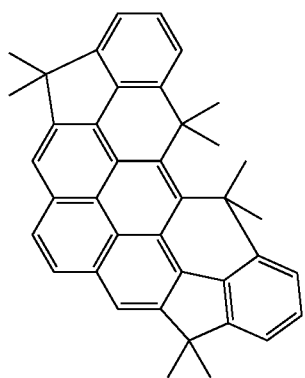 | 114 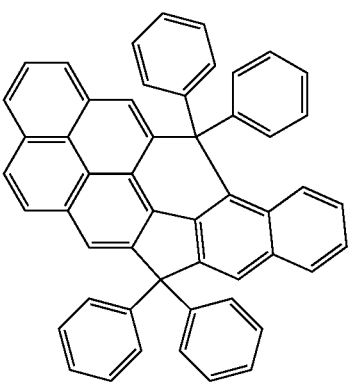 |
| 115 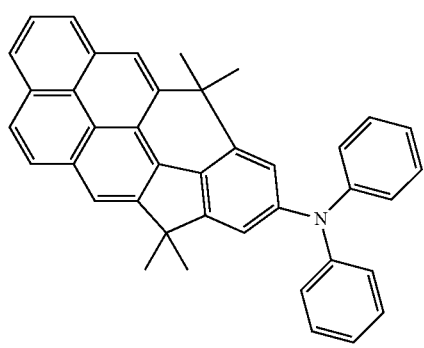 | 116 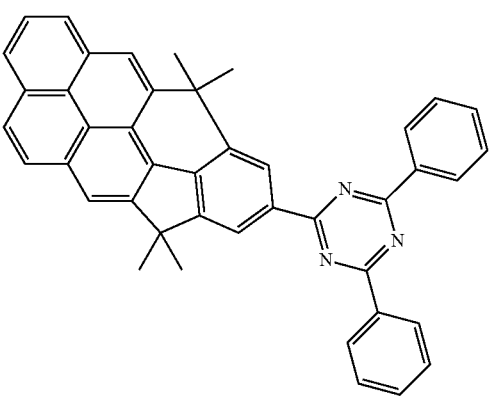 |
| 117 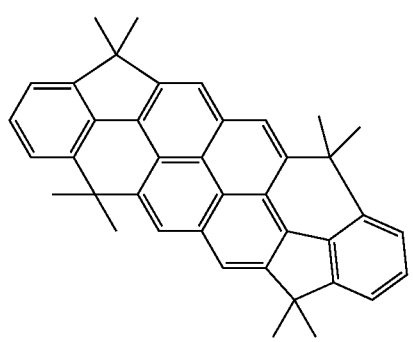 | 118 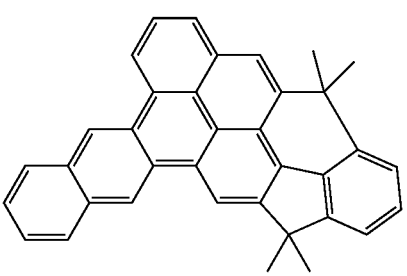 |

-continued
119 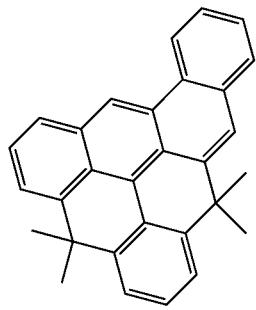
120 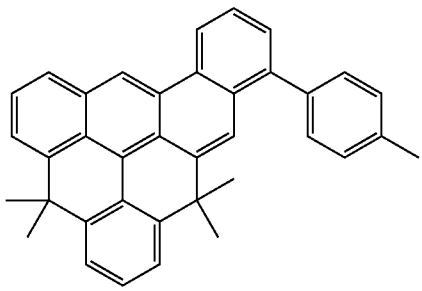
121 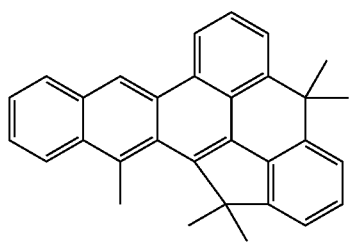
122 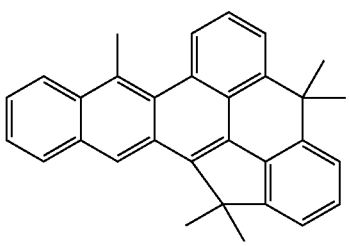
123 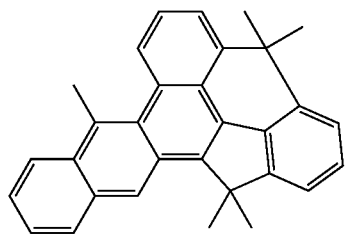
124 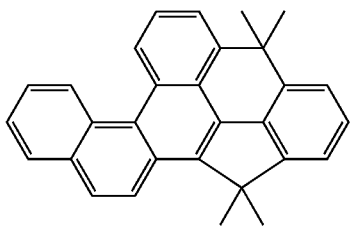
125 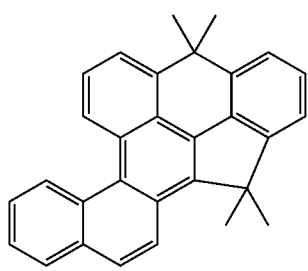
126 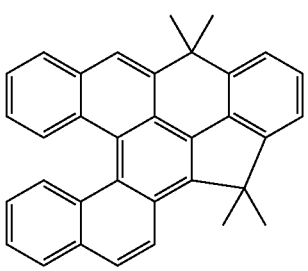
127 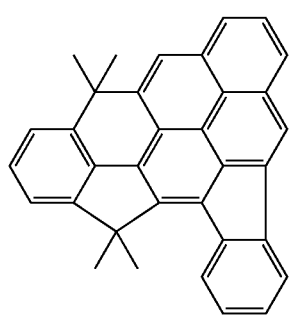
128 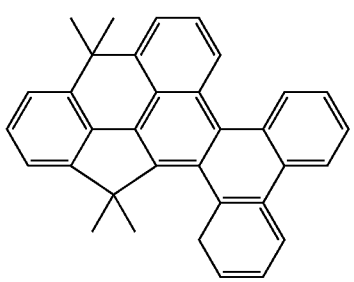

-continued
| 129 | 130 |
|---|---|
| 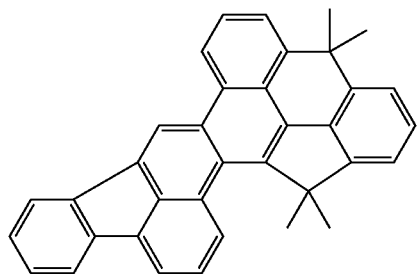 | 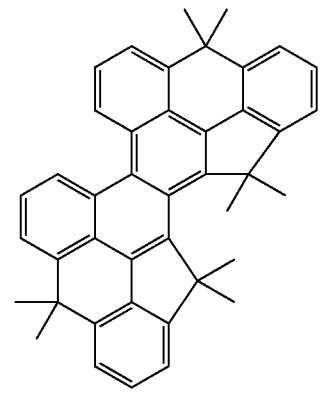 |
| 131 | 132 |
| 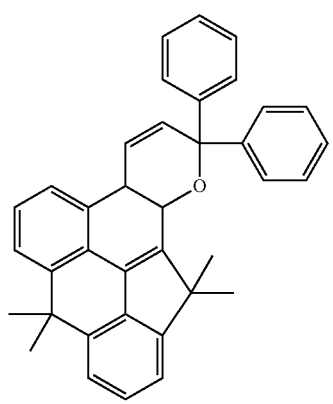 | 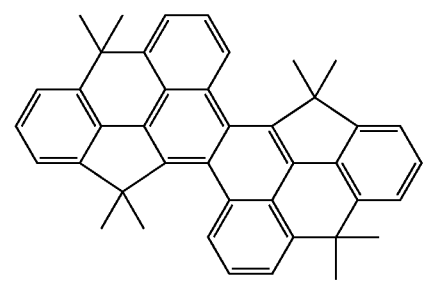 |
| 133 | 134 |
| 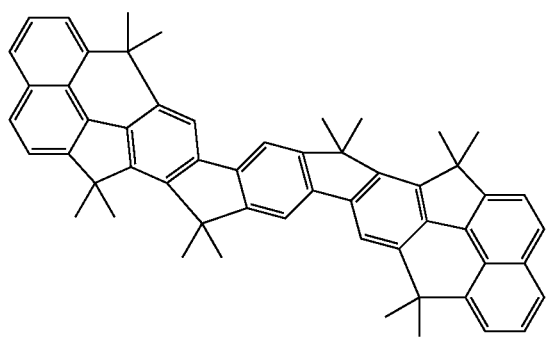 | 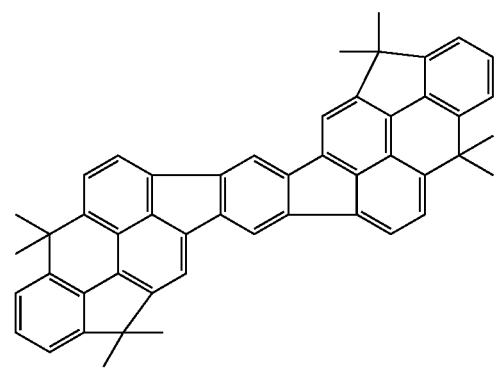 |
| 135 | 136 |
| 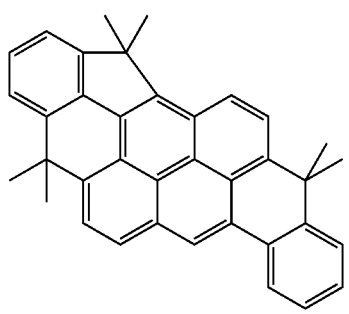 | 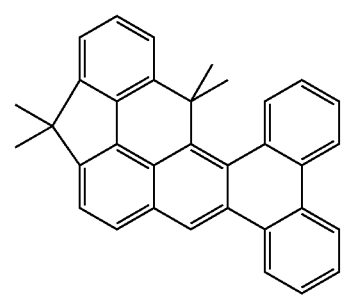 |

-continued
| 137 | 138 |
|---|---|
| 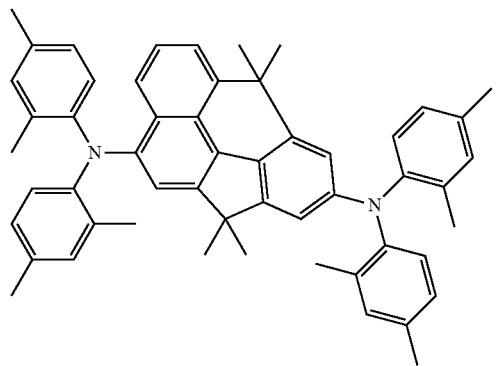 | 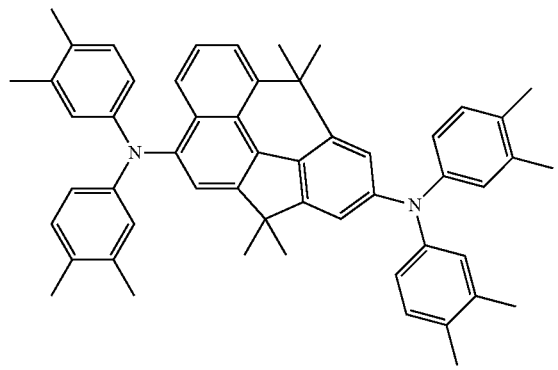 |
| 139 | 140 |
| 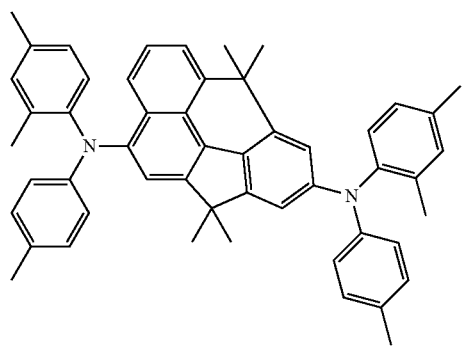 | 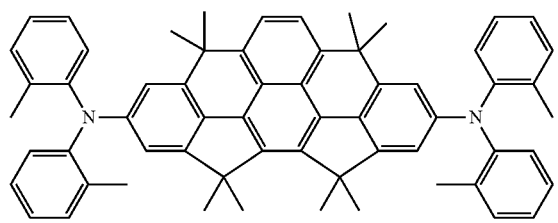 |
| 141 | 142 |
| 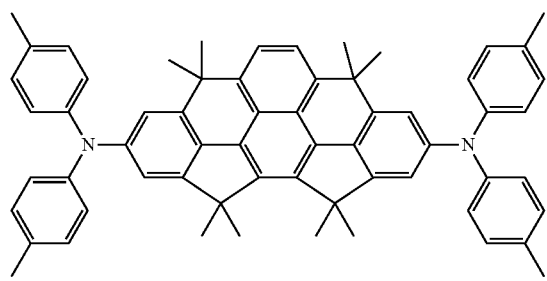 | 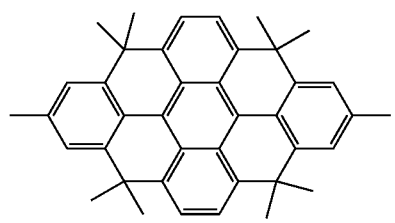 |
| 143 | 144 |
| 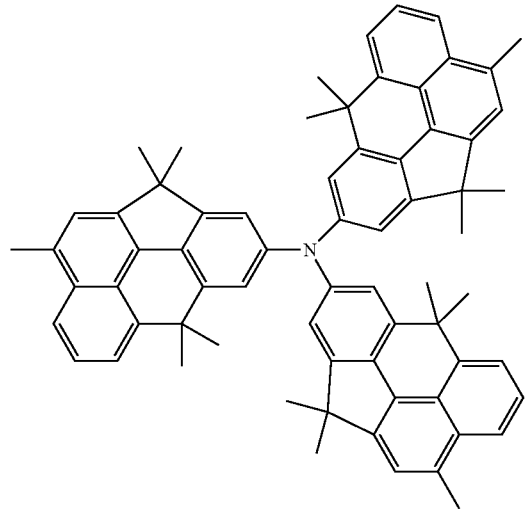 | 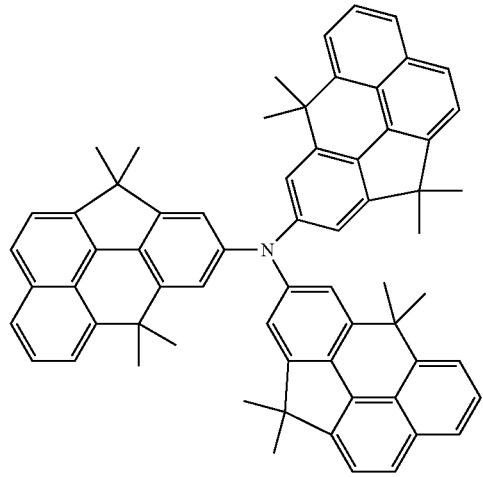 |

-continued
145
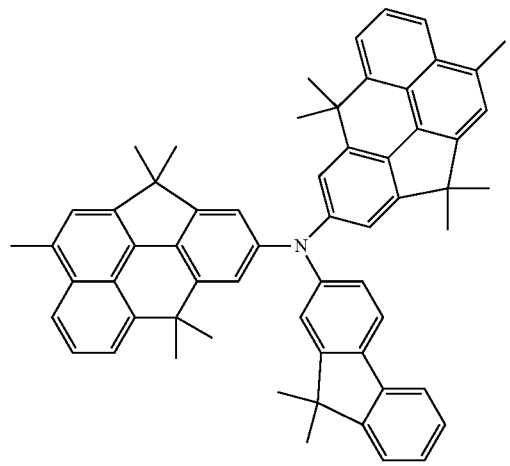
146
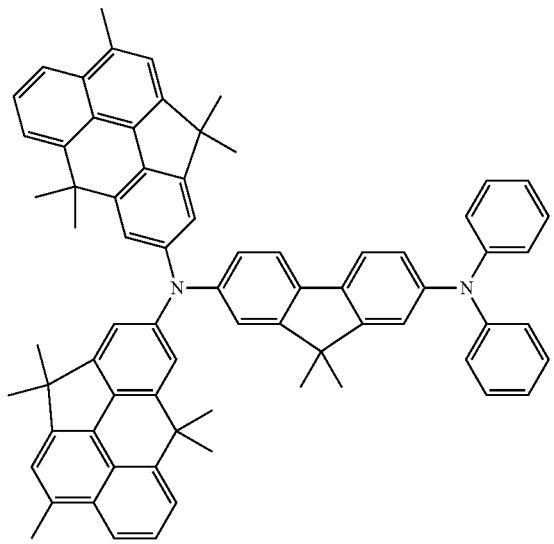
147
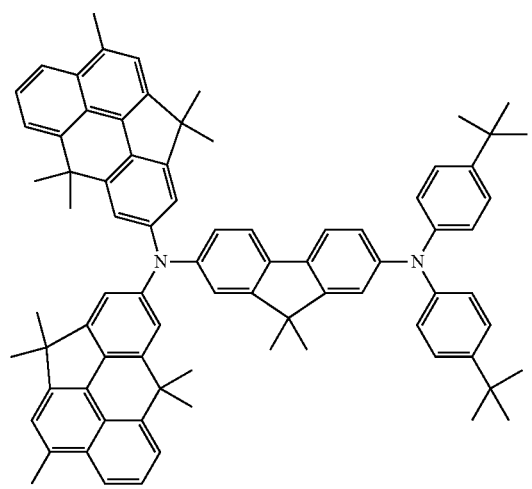
148
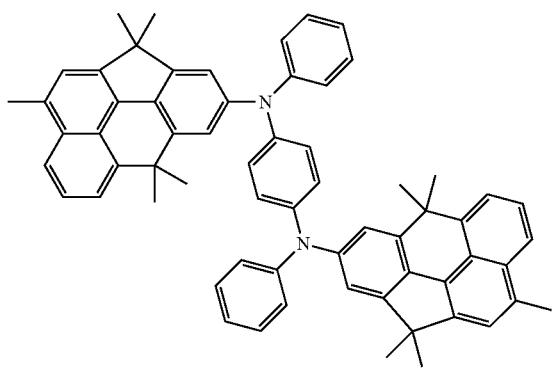
149
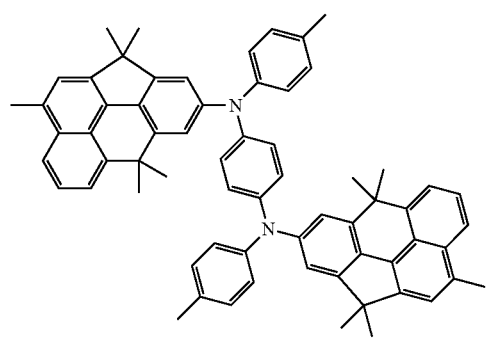
150
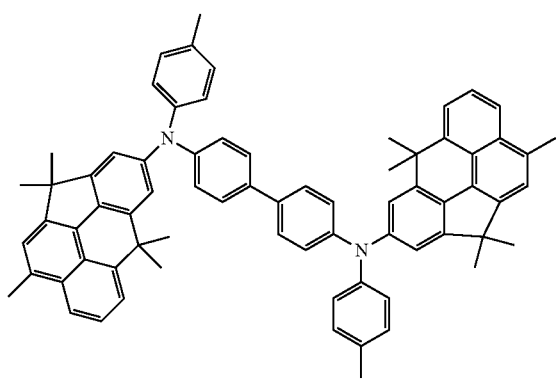

-continued
151
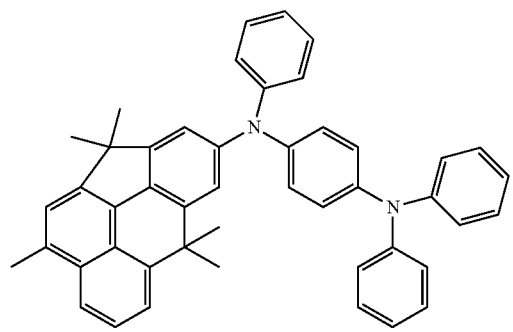
152
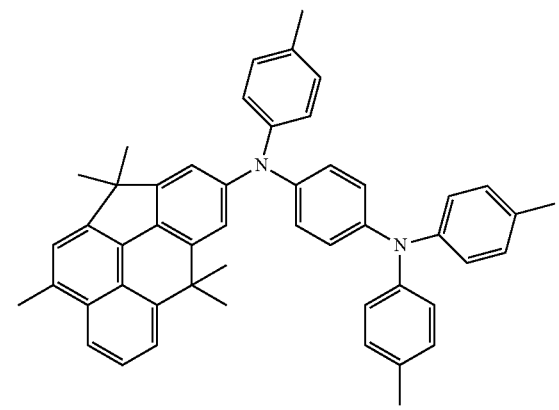
153
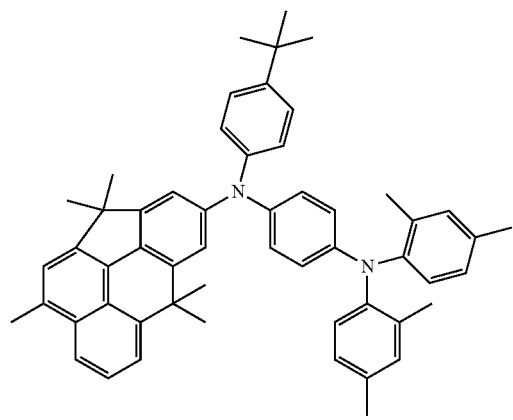
154
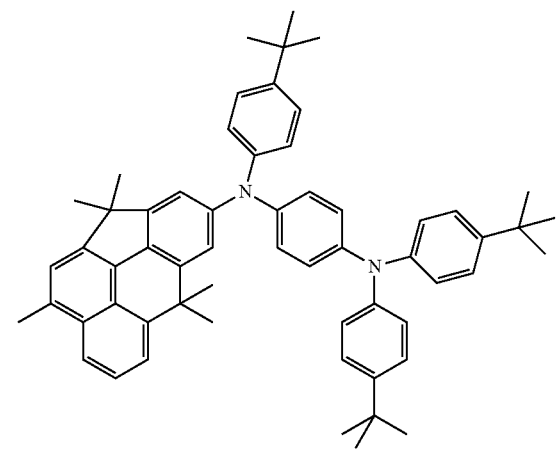
155
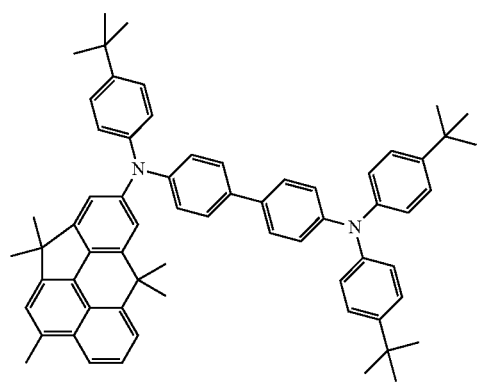
156
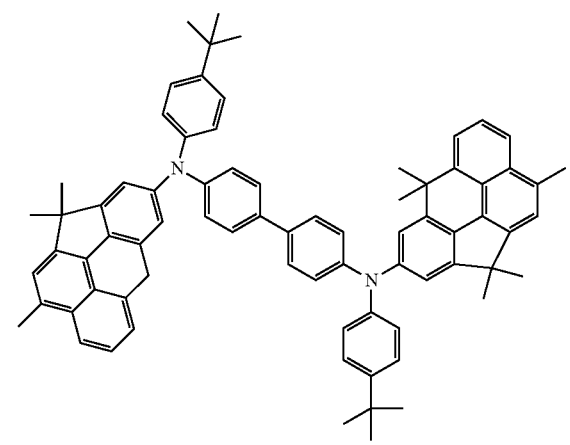
157
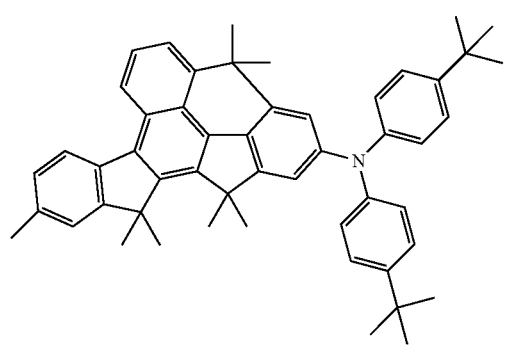
158
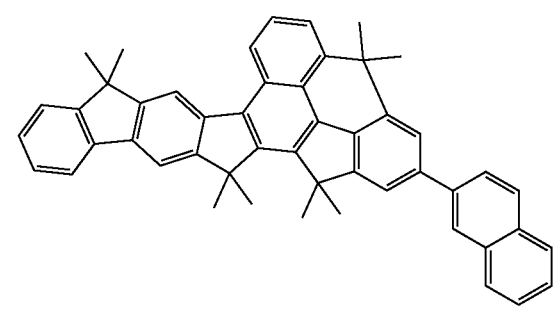

159
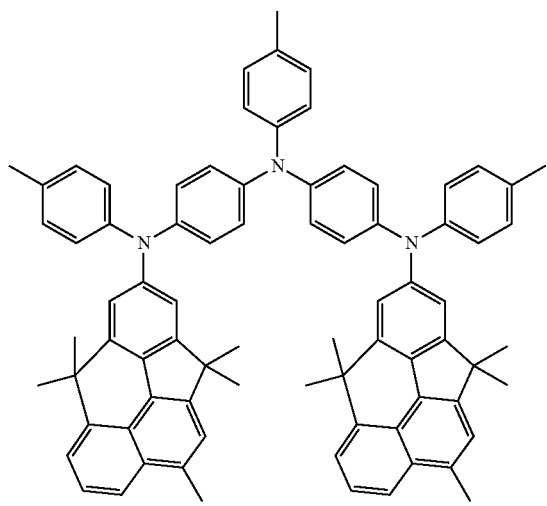
160
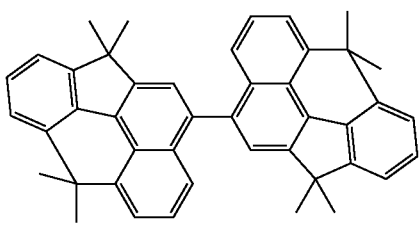
161
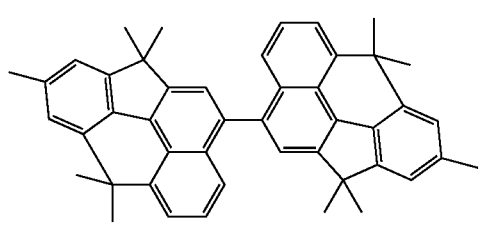
162
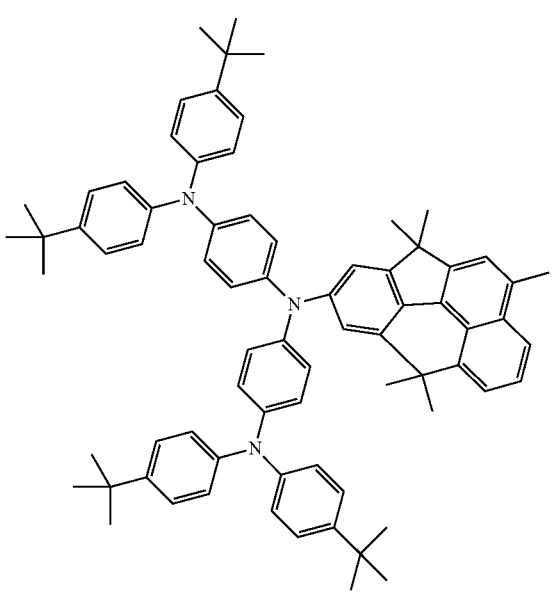
163
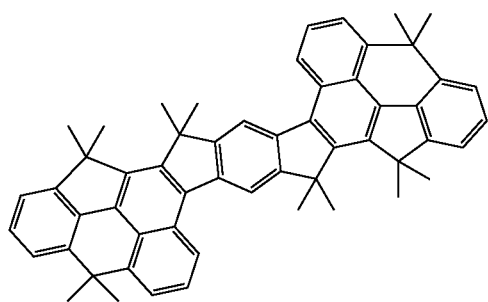
164
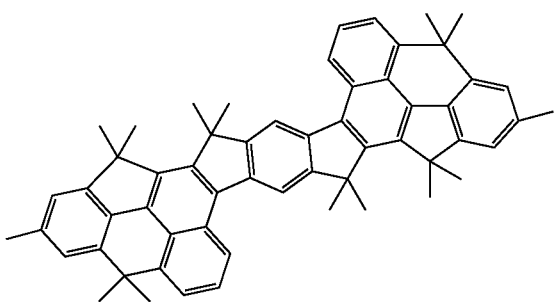

-continued
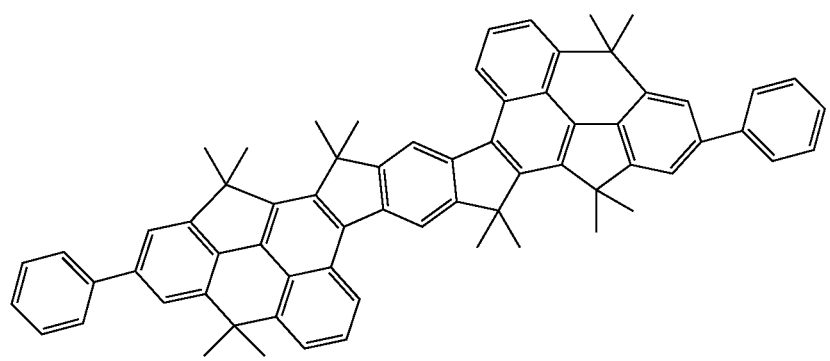
165
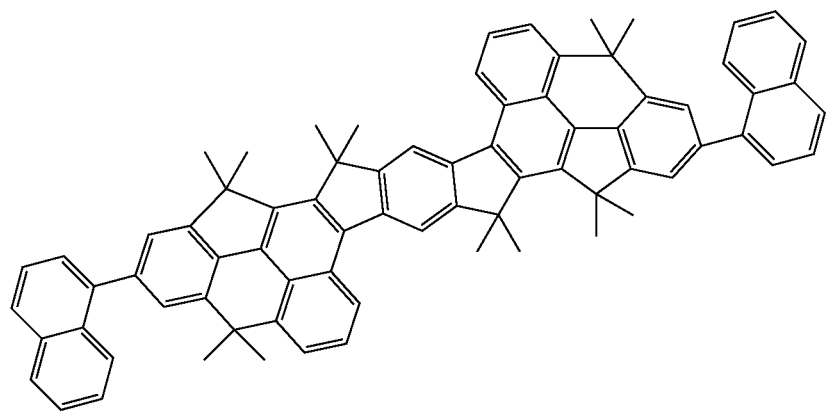
166
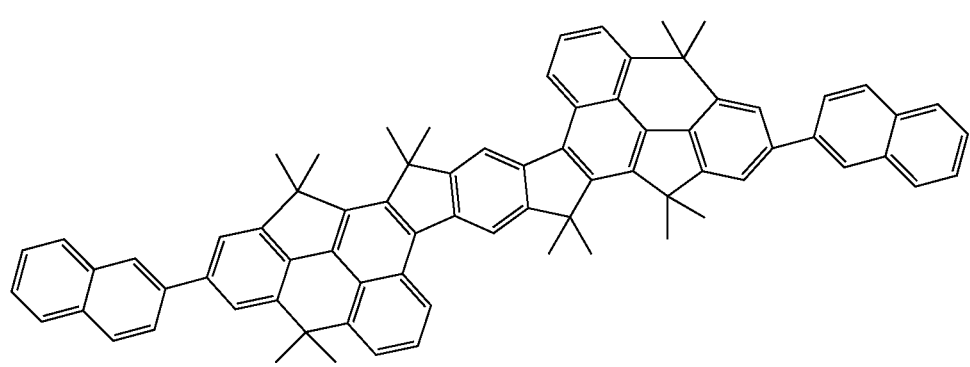
167
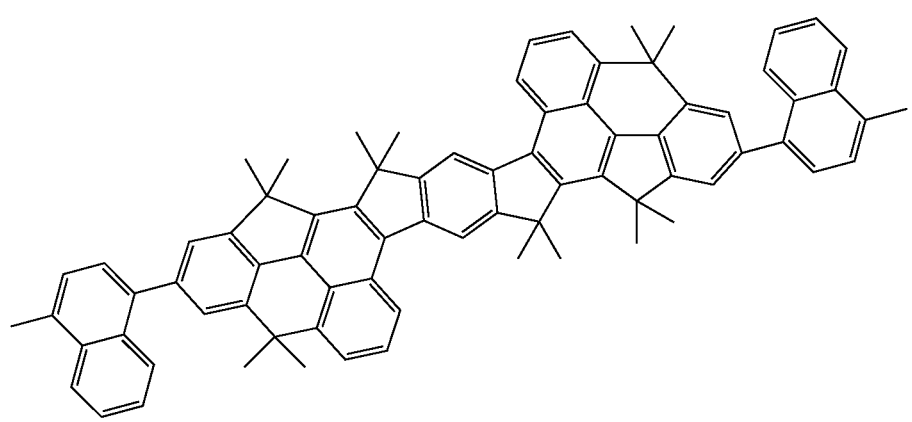
168

-continued
169
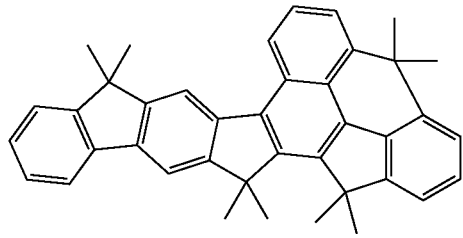
170
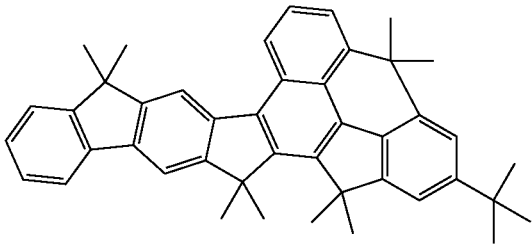
171
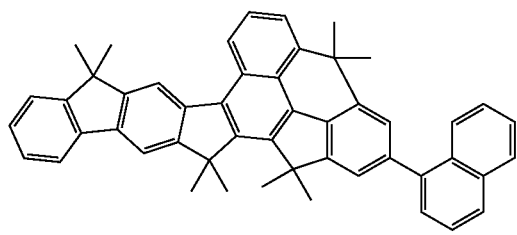
172
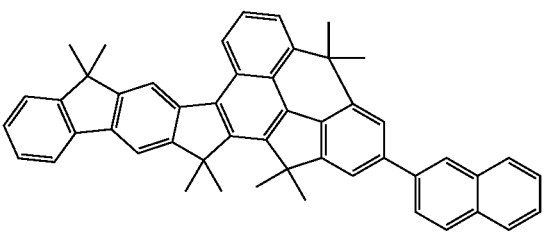
173
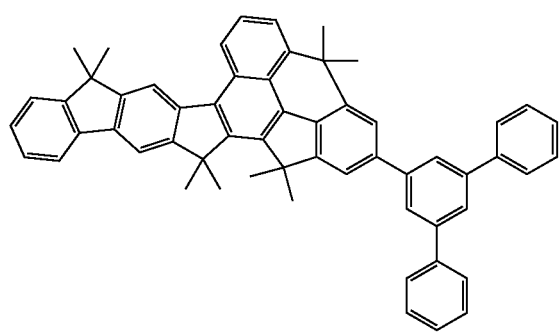
174
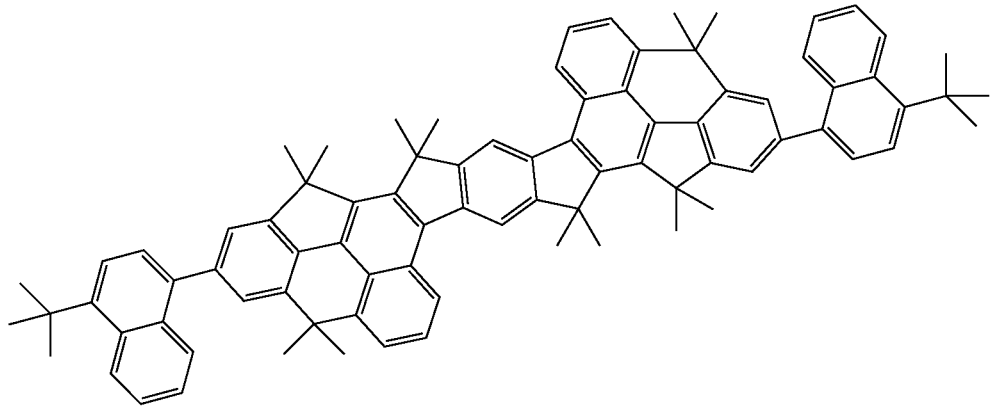
175
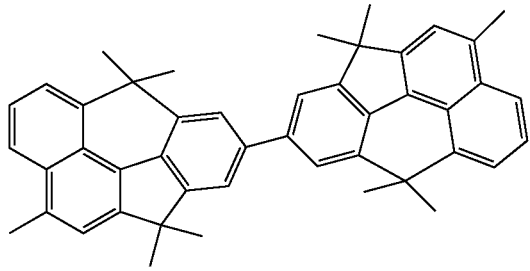
176
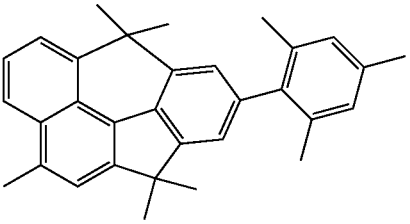

177
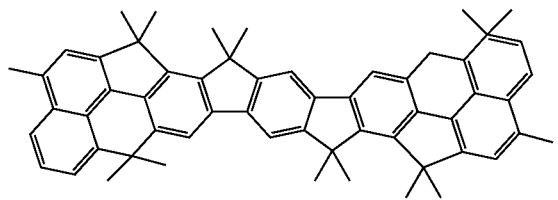
178
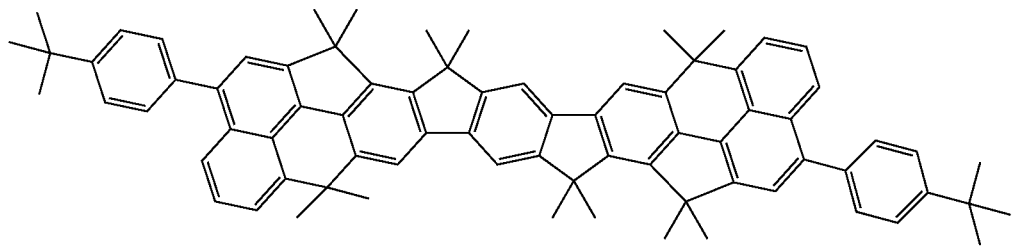
179
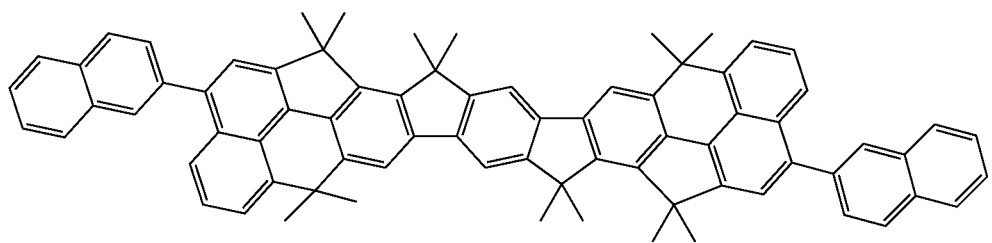
180
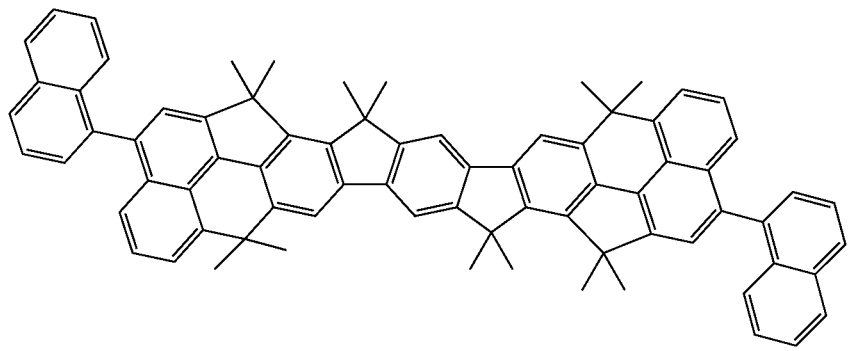
181
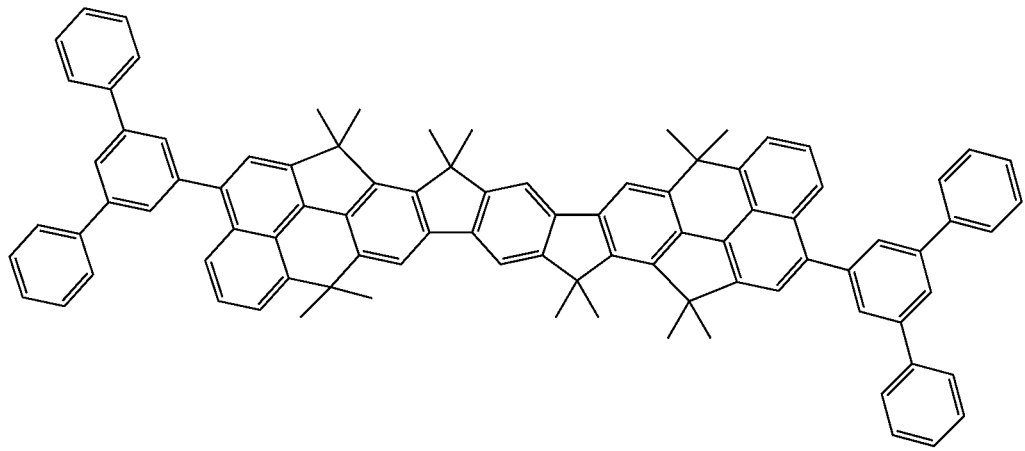

-continued

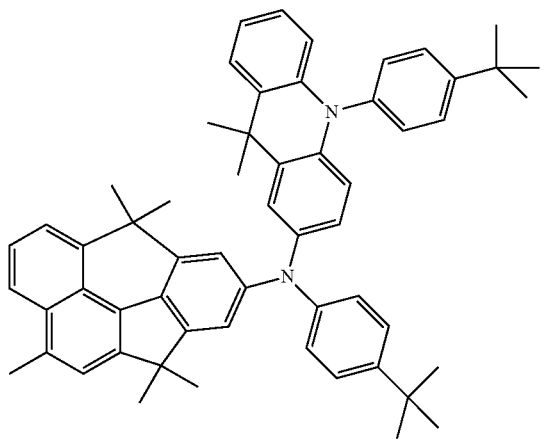
182

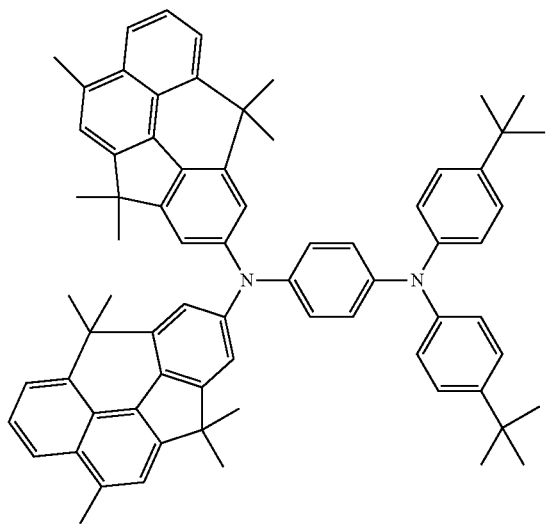
183

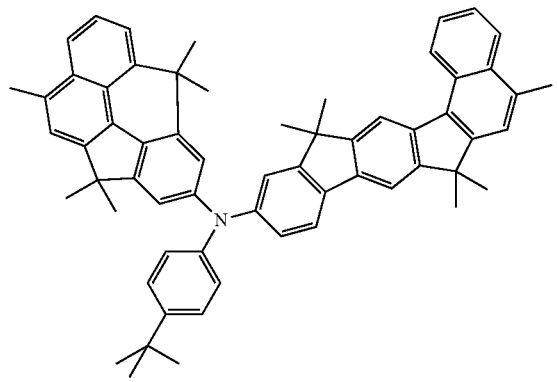
184

It may be preferred in the compounds defined above for one or more polymerisable functional groups or one or more electron-withdrawing or electron-donating groups to be present in the compounds.

If electron-withdrawing groups have been introduced into the compounds of the formulae (1) to (5), for example imidazole, triazine or pyrimidine derivatives or other electron-withdrawing groups, electron-transport materials result, which can be employed correspondingly as such. By contrast, substitution by electron-donating groups, for example arylamine groups, results in hole-injection or hole-transport materials, which can be employed correspondingly as such. Depending on the precise structure of materials of this type, these arylamino-substituted compounds can also be employed as fluorescent dopants. If the compounds according to the invention mentioned above are unsubstituted or monoaromatically substituted, they can be employed as fluorescent emitters or as host materials for fluorescent or phosphorescent emitters.

If polymerisable functional groups are present in the compounds defined above, these can be used for polymerisation of the compounds. In this way, dimers, oligomers, polymers or dendrimers can be prepared. To this end, particular preference is given to compounds which are substituted by reactive leaving groups, such as chlorine, bromine, iodine, boronic acid or boronic acid ester. These can also be used as comonomers for the preparation of corresponding conjugated, partially conjugated or non-conjugated polymers, oligomers or also as core of dendrimers. The polymerisation here preferably takes place via the halogen functionality or the boronic acid functionality.

For the purposes of this invention, the term oligomer is applied to a compound which has about three to nine recurring units. For the purposes of the invention, a polymer is taken to mean a compound which has ten or more recurring units.

The invention therefore furthermore relates to dimers, oligomers, polymers or dendrimers comprising one or more compounds of the formula (1), (2), (3), (4) or (5), as defined above, where one or more of the radicals R represent bonds to the next recurring unit. Depending on the linking of the compounds, the compounds form a main chain of an oligomer or polymer or a side chain of an oligomer or polymer or a dendrimer. The oligomers, polymers or dendrimers may be conjugated, partially conjugated or non-conjugated. The oligomers or polymers may be linear, branched or dendritic. In the linearly linked structures, the units of the formulae (1) to (5) may either be linked directly to one another or they may be linked to one another via a divalent group, for example via a substituted or unsubstituted alkylene group, via a heteroatom or via a divalent aromatic or heteroaromatic group. In branched structures, for example, three or more units of the formulae (1) to (5) may be linked via a trivalent or polyvalent group, for example via a trivalent or polyvalent aromatic or heteroaromatic group, to form a branched oligomer or polymer.

The same preferences as described above apply to the recurring units of the formulae (1) to (5) in oligomers and polymers.

For the preparation of the oligomers, polymers or dendrimers, the functionalised compounds of the general formula (1), (2), (3), (4) or (5) are homopolymerised or copolymerised with further monomers. In the case of the preparation of copolymers, it is preferred for the compounds of the formula (1), (2), (3), (4) or (5) to be present in the range from 0.1 to 50 mol %. Suitable and preferred comonomers are selected from fluorenes (for example in accordance with EP 842208 or WO 00/22026), spirobifluorenes (for example in accordance with EP 707020, EP 894107 or WO 06/061181), para-phenylenes (for example in accordance with WO 92/18552), carbazoles (for example in accordance with WO 04/070772 or WO 04/113468), thiophenes (for example in accordance with EP 1028136), dihydrophenanthrenes (for example in accordance with WO 05/014689), cis- and trans-indenofluorenes (for example in accordance with WO 04/041901 or WO 04/113412), ketones (for example in accordance with WO 05/040302), phenanthrenes (for example in accordance with WO 05/104264 or DE 102005037734) or also a plurality of these units. These polymers usually also comprise further units, for example emitting (fluorescent or phosphorescent) units, such as, for example, vinyltriarylamines (for example in accordance with DE 102005060473) or phosphorescent metal complexes (for example in accordance with WO 06/003000), and/or charge-transport units, in particular those based on triarylamines.

Since either one or two halogen functionalities, preferably bromine, can be introduced selectively into the compounds according to the invention, it is possible to build up dimers, trimers, tetramers, pentamers, etc. specifically. Thus, for example, two monofunctionalised compounds can be coupled in a Suzuki coupling or a Yamamoto coupling to give the corresponding dimers. The corresponding tetramers are accessible selectively by halogenation and further coupling to monofunctionalised compounds.

Furthermore, two monofunctionalised compounds can be coupled to a difunctionalised compound to give the corresponding trimer. The coupling reaction here is preferably a Suzuki coupling. The corresponding pentamers are accessible selectively by halogenation, preferably bromination, and further coupling to monofunctionalised compounds. It is likewise possible to functionalise the dimers, trimers, tetramers, pentamers, etc. further by, for example, halogenating them and reacting them with an arylamine in a Hartwig-Buchwald coupling to give the corresponding aromatic amines.

The compounds of the formulae (1) to (5) according to the invention can be prepared by synthetic steps known to the person skilled in the art. Thus, the various skeletons can be prepared, for example, by acid-catalysed cyclisation of the corresponding tertiary alcohols, as shown in general in Scheme 1 for compounds of the formulae (1) to (5). This skeleton can be functionalised by standard methods, for example by Friedel-Crafts alkylation or acylation. Furthermore, the skeleton can be brominated by standard methods of organic chemistry. The brominated compounds represent the basis for further functionalisations. Thus, they can be converted into extended aromatic compounds by Suzuki coupling to arylboronic acids or arylboronic acid derivatives or to organotin compounds by the Stille method. Coupling to aromatic or aliphatic amines by the Hartwig-Buchwald method gives the corresponding amines. Furthermore, the brominated derivatives can be converted into ketones via lithiation and reaction with electrophiles, such as benzonitrile, followed by acidic hydrolysis or into phosphine oxides using chlorodiphenylphosphines followed by oxidation.

The starting point that can be used in the synthesis is, for example, the dimethyl 2-bromoisophthalates (Organic Letters 2006, 8(25), 5841-5844) or 4-methylnaphthaleneboronic acid (WO 99/10339).

Scheme 1: General scheme for 5,6- and 6,6-linked aromatic compounds 5-6-linked aromatic compounds

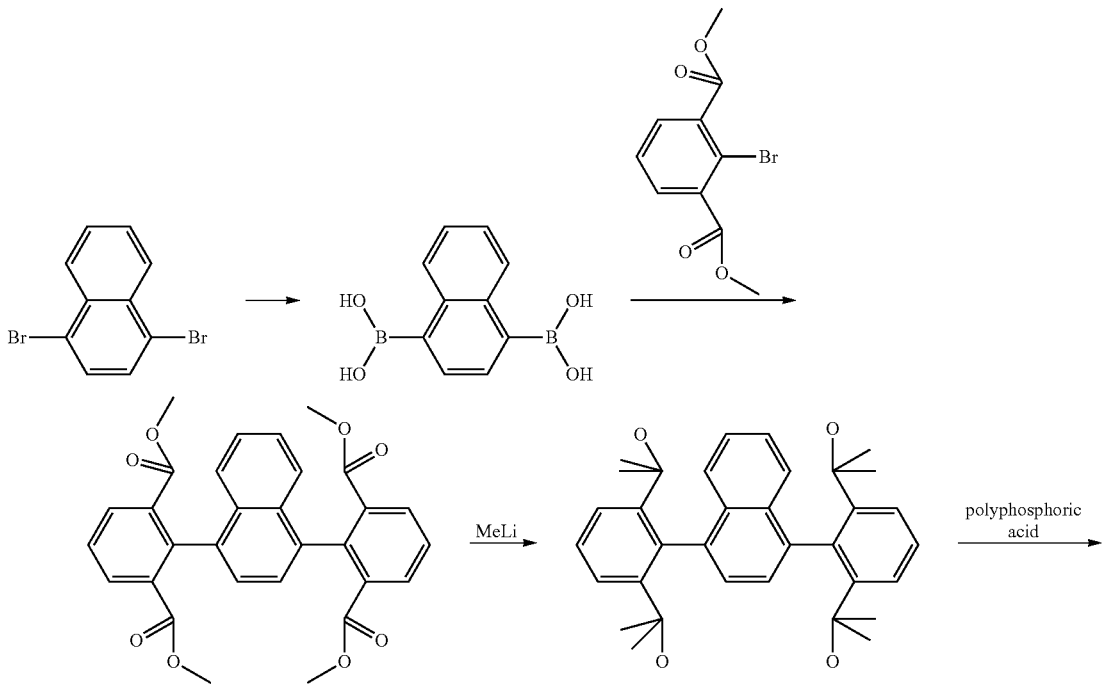

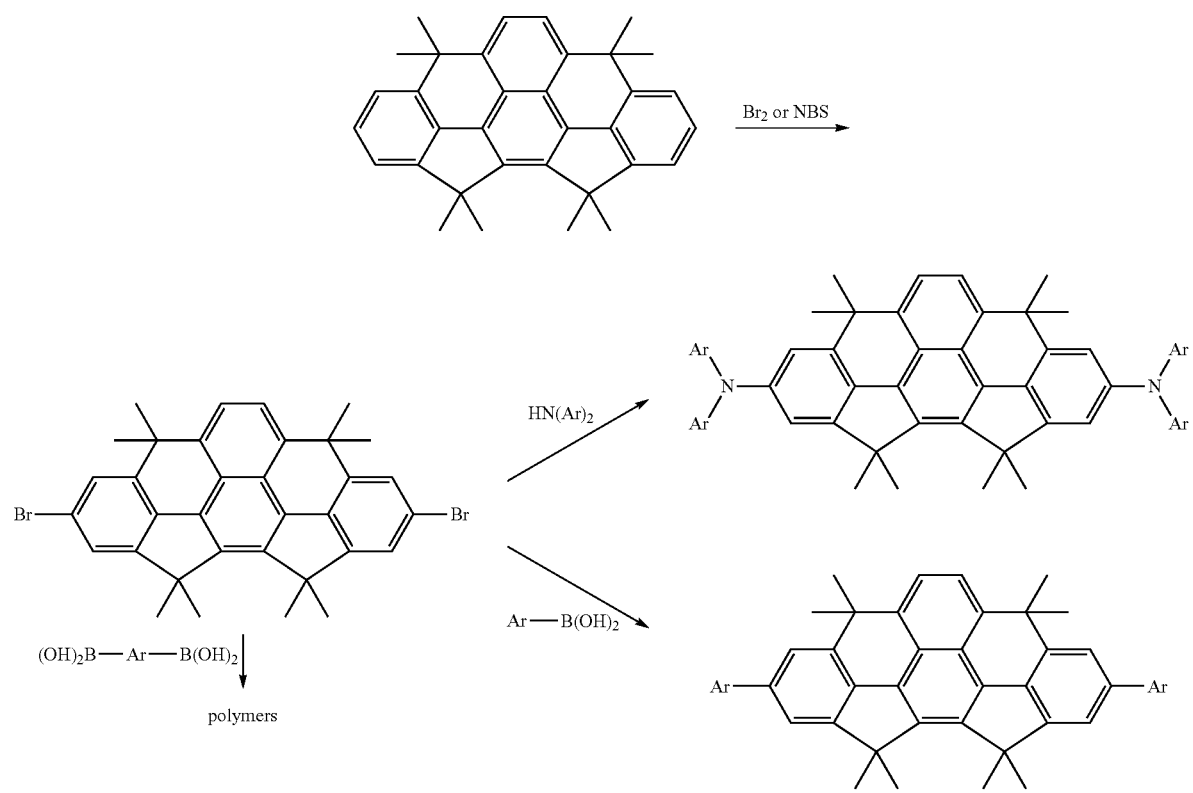
6-6-linked aromatic compounds
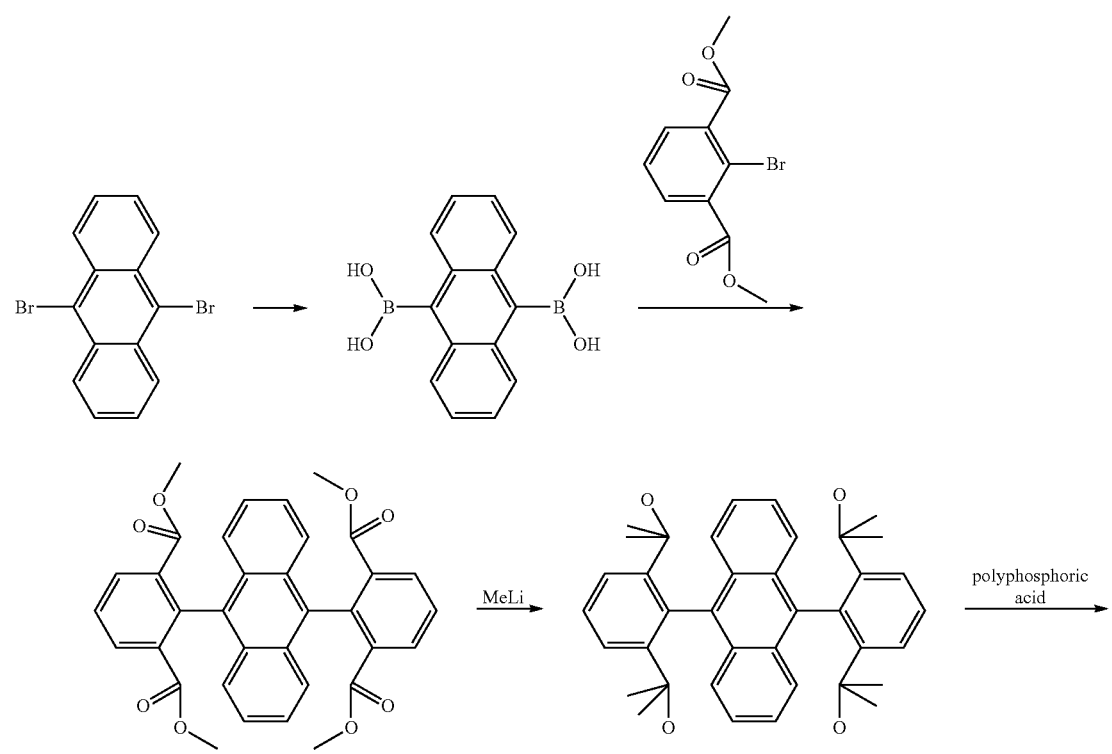

-continued

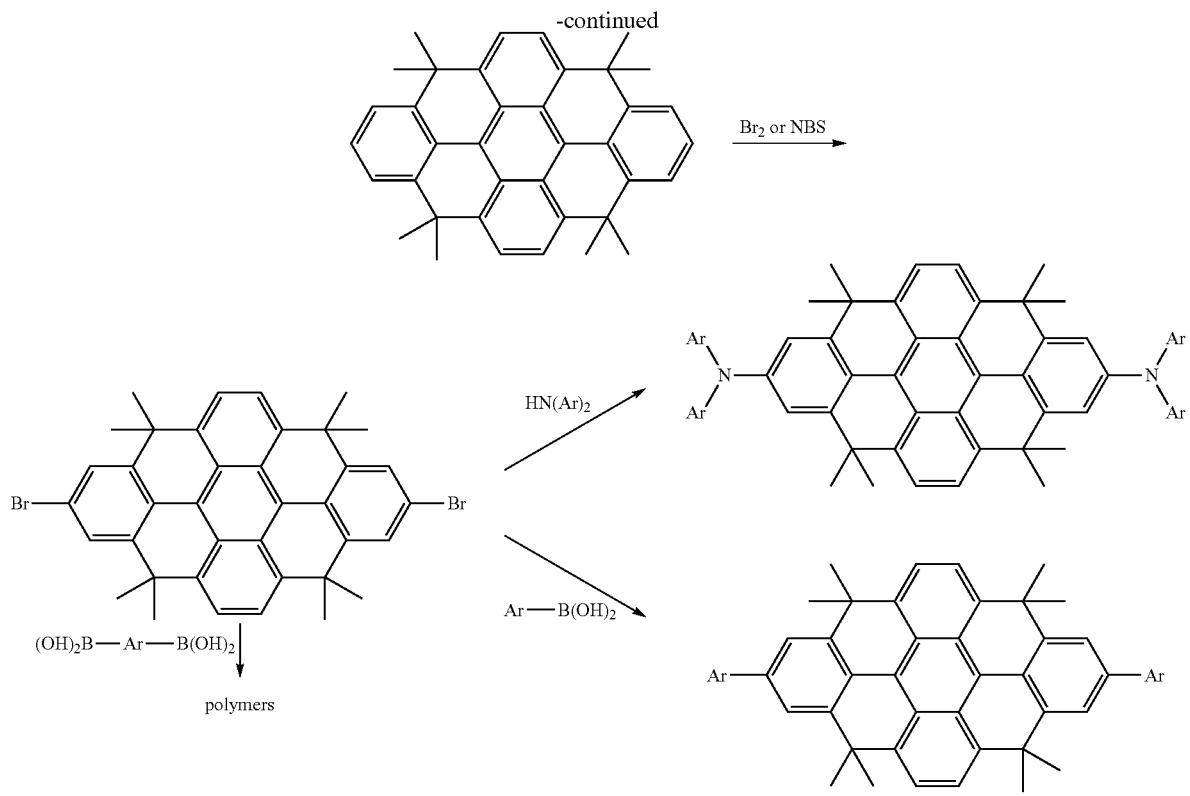

polymers

The invention accordingly also relates to a process for the preparation of the compounds of the general formulae (1), (2), (3), (4) and (5) according to the invention, characterised by the steps of
a) coupling of a functionalised naphthalene or a functionalised anthracene or a corresponding other functionalised condensed aromatic compound to an aromatic and/or heteroaromatic compound,
b) formation of one or more divalent bridges between the naphthalene or the anthracene and the aromatic and/or heteroaromatic compound via a ring-closure reaction.

Further steps which can be carried out are
c) functionalisation of the parent structure obtained by steps a) and b) by chlorination, bromination or iodination,
d) followed by Hartwig-Buchwald coupling to an aromatic amine or Suzuki coupling to an arylboronic acid or an arylboronic acid derivative or polymerisation.

In the process according to the invention, the divalent bridge is preferably formed from $B(R^1)$, $C(R^1)_2$, $Si(R^1)_2$, $C=NR^1$, $C=C(R^1)_2$, O, S, C=O, S=O, $SO_2$, $N(R^1)$, $P(R^1)$ and $P(=O)R^1$, where the symbols and indices used have the meaning indicated above.

The functional group on the naphthalene or anthracene is preferably a boronic acid group or a boronic acid derivative. The functional groups for the coupling to the aromatic or heteroaromatic compound are preferably chlorine, bromine or iodine, particularly preferably bromine. The further functional groups on the aromatic or heteroaromatic compound are preferably two ester groups of the formula C(=O)—O—R, where R stands for an alkyl group having 1 to 20 C atoms. The further functionalisation for the formation of the divalent bridge can be carried out, for example, by the addition reaction of an organolithium compound or a Grignard compound, giving a tertiary alcohol.

The invention also relates to the use of the compounds according to the invention or the use of the dimers, oligomers, polymers or dendrimers in an organic electronic device. The organic electronic device is preferably an organic light-emitting diode (OLED), an organic integrated circuit (O-IC), an organic field-effect transistor (O-FET), an organic thin-film transistor (O-TFT), an organic light-emitting transistor (O-LET), an organic solar cell (O-SC), an organic optical detector, an organic photoreceptor, an organic field-quench device (O-FQD), a light-emitting electrochemical cell (LEC) or an organic laser diode (O-laser).

The compounds according to the invention are preferably used within the electronic device as emitter compounds, as host material, as hole-trans-port compounds and/or electron-transport compounds. For use as hole-injection or hole-transport material, the compounds according to the invention are preferably provided with electron-donating groups, for example arylamine groups or the like. For use as electron-transport materials, the compounds according to the invention are preferably provided with electron-withdrawing groups, for example imidazole, triazine or pyrimidine derivatives. For use as host material, the compounds according to the invention are preferably suitable in their unsubstituted form or monoaromatically substituted form. They can thus be employed as host materials for fluorescent or phosphorescent emitters. For use as emitters, it is preferred for at least one substituent R to be an arylamine group $N(Ar)_2$ or a $CR^2=CR^2Ar$ group, or for the compound to be an unsubstituted hydrocarbon.

The use of doubly bridged aromatic compounds with 5- or 6-membered rings in the devices according to the invention gives rise to the advantage over the prior art that they have longer lifetimes at the same time as higher efficiency. In addition, these compounds can also be sublimed in greater amounts without noticeable decomposition and are therefore significantly easier to handle than many materials in accordance with the prior art.

The invention also relates to the use of the compounds according to the invention, depending on the precise structure, as charge-transport material and/or charge-injection material, preferably in a corresponding layer. These may be either hole-transport layers, hole-injection layers, electron-transport layers or electron-injection layers. The use as charge-blocking material, for example hole-blocking material, electron-blocking material or exciton-blocking material, is also possible.

The invention likewise relates to organic electronic devices or organic electroluminescent devices (organic light-emitting diodes, OLEDs), organic integrated circuits (O-ICs), organic field-effect transistors (O-FETs), organic thin-film transistors (O-TFTs), organic light-emitting transistors (O-LETs), organic solar cells (O-SCs), organic optical detectors, organic photoreceptors, organic field-quench devices (O-FQDs), light-emitting electrochemical cells (LECs) or organic laser diodes (O-lasers), but in particular organic electroluminescent devices (=Organic light-emitting diodes, OLEDs), comprising one or more compounds of the formulae (1) to (5), as defined above.

The compounds of the formulae (1) to (5) are preferably inside a layer in the electronic device.

The invention thus also relates to a layer, in particular an organic layer, comprising one or more compounds of the formulae (1) to (5), as defined above.

The same preferences for the compounds of the formulae (1) to (5) as mentioned above for product protection apply to the organic electronic devices.

The organic electroluminescent device comprises a cathode, anode and at least one emitting layer. Apart from these layers, it may also comprise further layers, for example in each case one or more hole-injection layers, hole-transport layers, hole-blocking layers, electron-transport layers, electron-injection layers, exciton-blocking layers and/or charge-generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*). One or more interlayers which have, for example, an exciton-blocking function may likewise be introduced between two emitting layers. However, it should be pointed out that each of these layers does not necessarily have to be present. These layers may comprise compounds of the general formulae (1) to (5), as defined above.

In a preferred embodiment of the invention, the compounds of the formulae (1) to (5) are employed as emitting compounds in an emitting layer. The organic electroluminescent device here may comprise one emitting layer or a plurality of emitting layers, where at least one emitting layer comprises at least one compound of the formulae (1) to (5), as defined above. If a plurality of emission layers are present, these preferably have in total a plurality of emission maxima between 380 nm and 750 nm, resulting overall in white emission, i.e. various emitting compounds which are able to fluoresce or phosphoresce are used in the emitting layers. Particular preference is given to three-layer systems, where the three layers exhibit blue, green and orange or red emission (for the basic structure, see, for example, WO 05/011013).

If the compounds of the formulae (1) to (5) are employed as emitting compounds in an emitting layer, a preferred use is in combination with one or more matrix materials (=host materials). A host material in a system comprising matrix (host) and dopant is taken to mean the component which is present in the system in the higher proportion. In a system comprising one host and a plurality of dopants, the host is taken to mean the component whose proportion in the mixture is the highest.

The mixture comprising compounds of the formulae (1) to (5) and the matrix material comprises between 1 and 50% by vol., preferably between 2 and 50% by vol., particularly preferably between 3 and 40% by vol., in particular between 5 and 15% by vol., of the compounds of the formulae (1) to (5), based on the entire mixture comprising emitter and matrix material. Correspondingly, the mixture comprises between 99 and 50% by vol., preferably between 98 and 50% by vol., particularly preferably between 97 and 60% by vol., in particular between 95 and 85% by vol., of the matrix material, based on the entire mixture comprising emitter and matrix material.

Suitable host materials (matrix materials) for this purpose are materials from various classes of substance. Preferred host materials are selected from the classes of the oligoarylenes (for example 2,2',7,7'-tetraphenyl-spirobifluorene in accordance with EP 676461 or dinaphthylanthracene), in particular the oligoarylenes containing condensed aromatic groups, the oligoarylenevinylenes (for example DPVBi or spiro-DPVBi in accordance with EP 676461), the polypodal metal complexes (for example in accordance with WO 04/081017), the hole-conducting compounds (for example in accordance with WO 04/058911), the electron-conducting compounds, in particular ketones, phosphine oxides, sulfoxides, etc. (for example in accordance with WO 05/084081 and WO 05/084082), the atropisomers (for example in accordance with WO 06/048268), the boronic acid derivatives (for example in accordance with WO 06/117052) or the benzanthracenes (for example in accordance with the unpublished application DE 102007024850.6). Particularly preferred host materials are selected from the classes of the oligoarylenes comprising naphthalene, anthracene, benzanthracene and/or pyrene or atropisomers of these compounds, the ketones, the phosphine oxides and the sulfoxides. Very particularly preferred host materials are selected from the classes of the oligoarylenes comprising anthracene, benzanthracene and/or pyrene or atropisomers of these compounds. For the purposes of this invention, an oligoarylene is intended to be taken to mean a compound in which at least three aryl or arylene groups are bonded to one another. Very particular preference is given to 9,10-diarylanthracene derivatives in which at least one aryl group is a condensed aryl group, or 2,9,10-triarylanthracene derivatives in which at least one aryl group is a condensed aryl group.

A further preferred application is the use of the compound as host material for fluorescent or phosphorescent emitters. For compounds which are used as matrix material for phosphorescent emitters, it is preferred for the bridging groups X to be selected, identically or differently, from $C(R^1)_2$ and $NR^1$, where one or more groups X are equal to $NR^1$ and where $R^1$ is as defined above and particularly preferably represents an electron-deficient heteroaryl group, for example triazine, pyrimidine, pyrazine, pyridine or imidazole.

The proportion of the host material of the formulae (1) to (5) in the emitting layer is then between 50.0 and 99.9% by vol., preferably between 80.0 and 99.5% by vol., particularly preferably between 90.0 and 99.0% by vol. Correspondingly, the proportion of the dopant is between 0.1 and 50.0% by vol., preferably between 0.5 and 20.0% by vol., particularly preferably between 1.0 and 10.0% by vol.

Preferred dopants are selected from the class of the monostyrylamines, the distyrylamines, the tristyrylamines, the tetrastyrylamines and the arylamines. A monostyrylamine is taken to mean a compound which contains one styryl group and at least one amine, which is preferably aromatic. A distyrylamine is taken to mean a compound which contains two styryl groups and at least one amine, which is preferably aromatic. A tristyrylamine is taken to mean a compound which contains three styryl groups and at least one amine, which is preferably aromatic. A tetrastyrylamine is taken to mean a compound which contains four styryl groups and at least one amine, which is preferably aromatic. For the purposes of this invention, an arylamine or an aromatic amine is taken to mean a compound which contains three aromatic or heteroaromatic ring systems bonded directly to the nitrogen, at least one of which is preferably a condensed ring system having at least 14 aromatic ring atoms. The styryl groups are particularly preferably stilbenes, which may also be substituted further on the double bond or on the aromatic system. Examples of dopants of this type are substituted or unsubstituted tristilbenamines or further dopants which are described, for example, in WO 06/000388, WO 06/058737, WO 06/000389, WO 07/065,549 and WO 07/115,610. Preferred dopants are furthermore compounds in accordance with WO 06/122630. Preferred dopants are furthermore arylamine derivatives or bis(diarylamine) derivatives of monobenzoindenofluorene or dibenzoindenofluorene, for example in accordance with WO 08/006,449 or WO 07/140,847. Dopants which are again furthermore preferred are the compounds disclosed in the unpublished application DE 102008035413.9.

A possible further use of compounds of the formulae (1) to (5) is the use as hole-transport or hole-injection material in a hole-transport or hole-injection layer. This use is particularly suitable if one or more bridges X stand for S or $NR^1$ and/or if one or more radicals R stand for $N(Ar)_2$. Compounds of this type can furthermore also be employed in an electron-blocking layer.

A further possible use of compounds of the formulae (1) to (5) is the use as electron-transport material in an electron-transport layer. Particularly suitable for this purpose are compounds of the formulae (1) to (5) which are substituted by at least one electron-deficient heteroaromatic group. Electron-deficient heteroaromatic groups are 6-membered heteroaromatic rings having at least one nitrogen atom and corresponding condensed systems, for example pyridine, pyrazine, pyrimidine, pyridazine, triazine, quinoline, quinoxaline or phenanthroline, or 5-membered heteroaromatic rings having at least one nitrogen atom and a further heteroatom selected from N, O or S, and corresponding condensed systems, for example pyrazole, imidazole, oxazole, oxadiazole or benzimidazole. If the compounds of the formulae (1) to (5) are used as electron-transport material, the bridge X preferably stands for $C(R^1)_2$. In addition, the compounds are also suitable as electron-transport materials if at least one bridge X stands for C=O, $P(=O)R^1$, SO or $SO_2$. Compounds of this type can furthermore also be employed in a hole-blocking layer.

Preference is furthermore given to an organic electroluminescent device in which one or more layers are applied by a sublimation process, in which the materials are vapour-deposited in vacuum sublimation units at an initial pressure of less than $10^{-5}$ mbar, preferably less than $10^{-6}$ mbar, particularly preferably less than $10^{-7}$ mbar.

Preference is likewise given to an organic electroluminescent device, characterised in that one or more layers are applied by the OVPD (organic vapour phase deposition) process or with the aid of carrier-gas sublimation, in which the materials are applied at a pressure between $10^{-5}$ mbar and 1 bar.

Preference is furthermore given to an organic electroluminescent device, characterised in that one or more layers are produced from solution, such as, for example, by spin coating, or by any desired printing process, such as, for example, screen printing, flexographic printing or offset printing, but particularly preferably LITI (light induced thermal imaging, thermal transfer printing) or ink-jet printing. Soluble compounds, which are obtained, if necessary, by suitable substitution, are necessary for this purpose. These methods are also particularly suitable for oligomers and polymers.

These processes are generally known to the person skilled in the art and can be applied by him without problems to organic electroluminescent devices comprising compounds of the formulae (1) to (5), as defined above.

The invention is now explained in greater detail with reference to some examples, which should not be understood to be restrictive regarding the scope of the invention.

EXAMPLES

The following syntheses are, unless indicated otherwise, carried out under a protective-gas atmosphere in dried solvents.

Scheme 2:
General synthetic procedure:

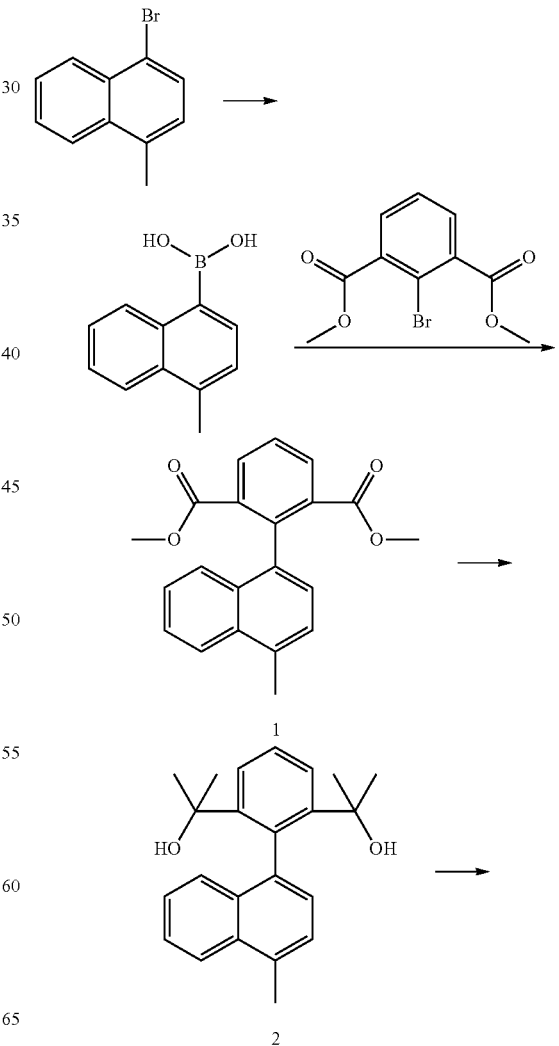

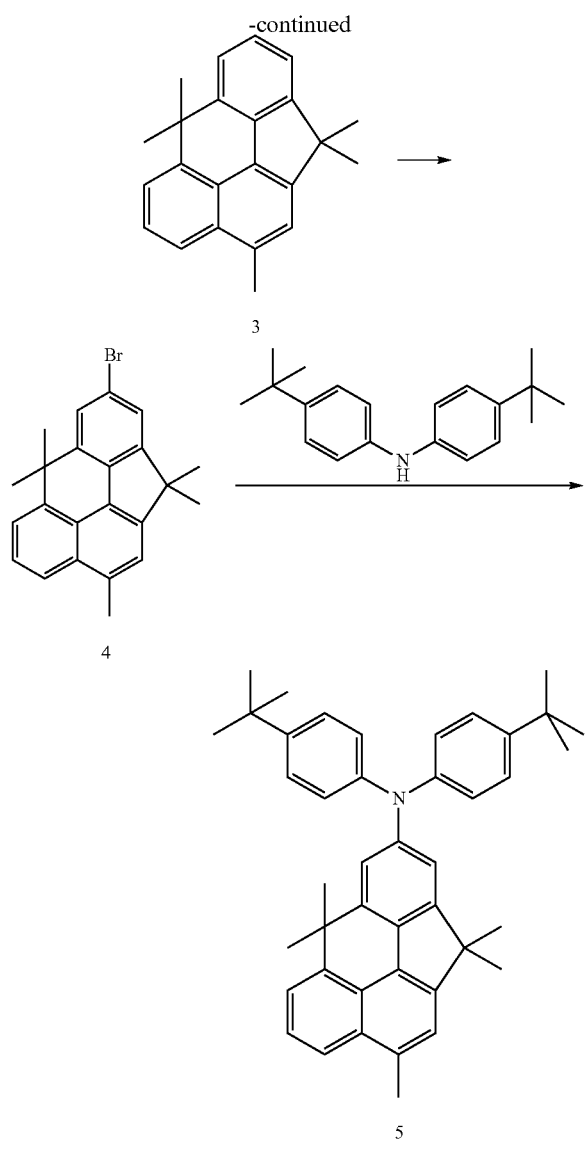

Example 1

Synthetic procedure for the preparation of dimethyl 2-(4-methylnaphthalen-1-yl)isophthalate 1

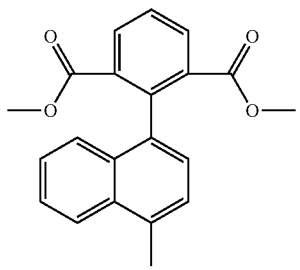

35 g (148 mmol) of 4-methylnaphthaleneboronic acid, 33.8 g (124 mmol) of dimethyl 2-bromoisophthalate and 220 ml of 2 M Na₂CO₃ solution are suspended in 1 l of toluene and 1 l of EtOH, the mixture is saturated with N₂, 2.9 g (3 mmol) of tetrakis(triphenylphosphine)palladium(0) are added, and the mixture is heated at the boil for 2 h. The mixture is poured into 3 l of a mixture of water/MeOH/6 M HCl 1:1:1, the beige precipitate is filtered off with suction, washed with water, EtOH and toluene and dried. The content of product according to ¹H-NMR is about 95% with an overall yield of 37 g (90%).

Example 2

Synthetic procedure for the preparation of 2-[3-(1-hydroxy-1-methylethyl)-2-(4-methyl-naphthalen-1-yl)phenyl]propan-2-ol 2

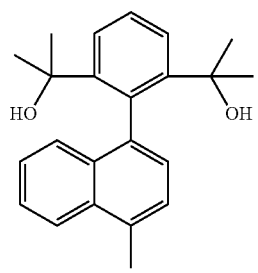 [SMILES: Cc1ccc(-c2c(C(C)(C)O)cccc2C(C)(C)O)c2ccccc12]

Under a protective gas, 73 g (227 mmol) of dimethyl 2-(4-methyl-naphthalen-1-yl)isophthalate (from Example 1) are initially introduced in 2000 ml of THF and cooled to 0° C. At this temperature, 300 ml of 2 M methylmagnesium chloride solution are added dropwise, and the mixture is subsequently brought to room temperature overnight. 600 ml of saturated NH₄Cl solution and 900 ml of water/conc. HCl 8:1 are added to the solution. The phases are separated, and the solvent is removed in vacuo. The content of product according to ¹H-NMR is about 90% with an overall yield of 76.2 g (90%).

Example 3

Synthetic procedure for the preparation of 1,1,5,5,9-pentamethyl-1,5-dihydrobenzo[m,n,o]acetanthrylene 3

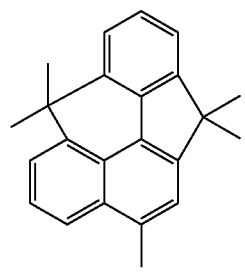

Under a protective gas, 66.9 g (200 mmol) of 2-[3-(1-hydroxy-1-methyl-ethyl)-2-(4-methylnaphthalen-1-yl)phenyl]propan-2-ol (from Example 2) are initially introduced in 268 g (2734 mmol) of polyphosphoric acid and cooled to 0° C. The mixture is subsequently stirred at 100° C. for 3 h and then cooled to room temperature. Water is added to the mixture with ice-cooling, the mixture is extracted with ethyl

Example 4

Synthetic procedure for the preparation of 3-bromo-1,1,5,5,9-pentamethyl-1,5-dihydrobenzo[m,n,o]acetanthrylene 4

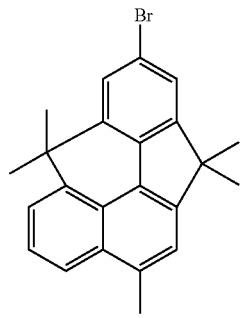

Under a protective gas, 51 g (173 mmol) of 1,1,5,5,9-pentamethyl-1,5-dihydrobenzo[m,n,o]acetanthrylene (from Example 3) are initially introduced in 1500 ml of chloroform and cooled to 0° C. 31 g (174 mmol) of NBS are added to this solution in portions, and the mixture is stirred overnight Na$_2$SO$_3$ solution is added to the mixture, the phases are separated, and the solvent is removed in vacuo. The content of product according to $^1$H-NMR is about 95% with an overall yield of 46 g (71%).

Example 5

Synthetic procedure for bis(4-tert-butylphenyl)(1,1,5,5,9-pentamethyl-1,5-dihydrobenzo[m,n,o]acetanthrylen-3-yl)amine 5

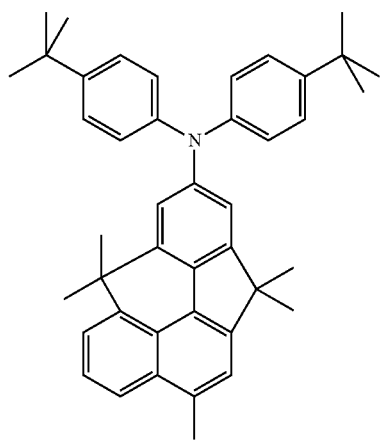 [SMILES: Cc1cc2c3c4c(cccc14)C(C)(C)c1cc(N(c4ccc(C(C)(C)C)cc4)c4ccc(C(C)(C)C)cc4)cc(c1-3)C2(C)C]

A degassed solution of 32.7 g (86.6 mmol) of 3-bromo-1,1,5,5,9-pentamethyl-1,5-dihydrobenzo[m,n,o]acetanthrylene (from Example 4) and 27 g (95.9 mmol) of bis(4-tert-butylphenyl)amine in 1000 ml of dioxane is saturated with N$_2$ for 1 h. Then firstly 0.9 ml (4.3 mmol) of P($^t$Bu)$_3$, then 0.480 g (2.1 mmol) of palladium acetate are added to the solution, and 12.6 g (131 mmol) of NaOtBu in the solid state are subsequently added. The reaction mixture is heated under reflux for 18 h. After the mixture has been cooled to room temperature, 1000 ml of water are carefully added. The organic phase is washed with 4×50 ml of H$_2$O, dried over MgSO$_4$, and the solvents are removed in vacuo. The pure product is obtained by recrystallisation. The content of product according to HPLC is 99.9% with an overall yield of 40 g (80%).

Example 6

Synthetic procedure for the preparation of 3-nitro-1,1,5,5,9-pentamethyl-1,5-dihydrobenzo[m,n,o]acetanthrylene 6

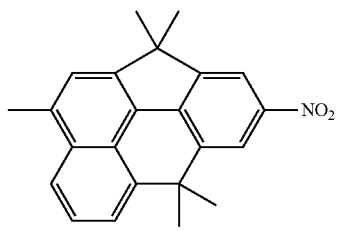 [SMILES: Cc1cc2c3c4c(cccc14)C(C)(C)c1cc([N+](=O)[O-])cc(c1-3)C2(C)C]

12.0 ml of glacial acetic acid and 1.39 ml (33.5 mmol) of fuming nitric acid are carefully mixed in a 50 ml two-necked flask under a protective-gas atmosphere with ice-cooling. 10.0 g (33.5 mmol) of the aromatic compound 3 are dissolved in 75 ml of nitrobenzene in a 250 ml four-necked flask under a protective-gas atmosphere. The glacial acetic acid/nitric acid mixture is slowly added dropwise to this solution at 0° C., and the reaction mixture is slowly brought to RT with TLC monitoring. When the reaction is complete, the batch is carefully added to ice-water, a sufficient amount of ethyl acetate is added, and the phases are separated, dried and evaporated, giving 9.8 g (85%) of the product as a yellow-brown solid, which can be employed directly in the next transformation.

Example 7

Synthetic procedure for the preparation of 1,1,5,5,9-pentamethyl-1,5,8b,10b-tetrahydrobenzo[m,n,o]acetanthrylen-3-ylamine 7

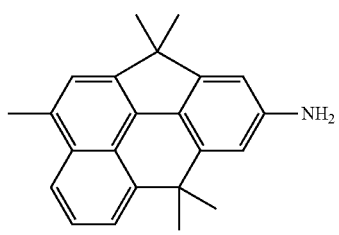 [SMILES: Cc1cc2c3c4c(cccc14)C(C)(C)c1cc(N)cc(c1-3)C2(C)C]

10.0 g (29.1 mmol) of the nitro compound 6 are suspended in 100 ml of methanol, and 0.74 g of Pd/C (10%) is added under a protective-gas atmosphere, and the mixture is cooled to 0° C. At this temperature, 2.9 g (78.6 mmol) of NaBH$_4$ are carefully added in small portions. The reaction solution is monitored via TLC and slowly brought to room temperature. When the reaction is complete, 100 ml of methanol are added with ice-cooling, and the hydrogen is discharged. Water is subsequently carefully added at 0° C., and the mixture is extracted with a sufficient amount of dichloromethane, dried and evaporated. The crude product is washed by stirring with hot toluene/heptane 1:25, giving 6.8 g (74%) of the product as a pale solid.

Example 8

Synthetic procedure for the preparation of tris(1,1,5,5,9-pentamethyl-1,5,8b,10b-tetrahydrobenzo[m,n,o]acetanthrylen-3-yl)amine 8

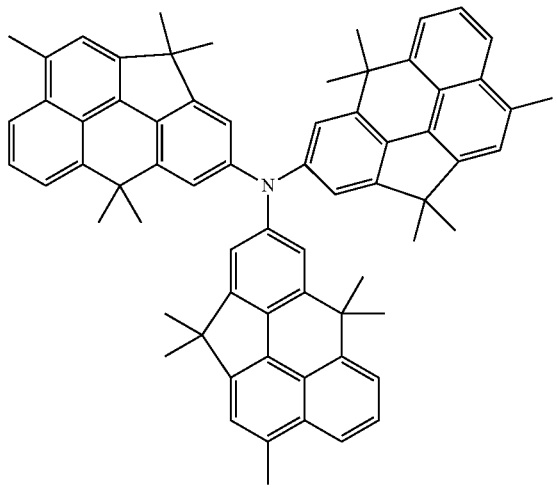 [SMILES: Cc1cc2c3c4c(cccc14)C(C)(C)c1cc(N(c4cc5c6c(c4)C(C)(C)c4cccc7c(C)cc(c-6c47)C5(C)C)c4cc5c6c(c4)C(C)(C)c4cccc7c(C)cc(c-6c47)C5(C)C)cc(c1-3)C2(C)C]

4.15 g (13.25 mmol) of the amine 7 are suspended in 125 ml of toluene with 10.0 g (26.5 mmol) of the bromide 4, and the mixture is degassed by passing in $N_2$ for 30 min. 0.66 ml of tris-tert-butylphosphine (1 M/l in toluene) is injected into the suspension, and 59.5 mg (0.27 mmol) of Pd(OAc)$_2$ are added. The mixture is then briefly degassed, and 1.91 g (18.9 mmol) of NaO$^t$Bu (degassed as solid) are then added, and the reaction mixture is stirred under vigorous reflux for 3 h. The reaction solution is cooled, diluted with toluene/ethyl acetate and filtered through Alox B (activity grade 1). Crystallisation from heptane/toluene 10:1 gives 8.7 g (73%) of the product as a white powder.

Example 9

Production of OLEDs

The production of OLEDs according to the invention is carried out by a general process in accordance with WO 04/058911, which has been adapted to the circumstances described here (layer-thickness variation, materials used).

Examples 9.1 to 9.4 below present the results for a number of OLEDs. Glass plates coated with structured ITO (indium tin oxide) form the substrates of the OLEDs. For improved processing, 20 nm of PEDOT (spin-coated from water; purchased from H. C. Starck, Goslar, Germany; poly(3,4-ethylenedioxy-2,5-thiophene)) is applied to the substrate.

The OLEDs consist of the following layer sequence: substrate/PEDOT (20 nm)/HIL1 (5 nm)/HIL2 (110 nm or 140 nm)/HTM (20 nm)/emission layer=EML (30 nm)/AlQ$_3$ (20 nm) and finally a cathode. The OLEDs from Examples 9.1 and 9.2 comprise an HIL2 layer with a thickness of 110 nm and those from Examples 9.3 and 9.4 comprise an HIL2 layer with a thickness of 140 nm.

All materials apart from PEDOT are vapour-deposited thermally in a vacuum chamber. The emission layer here always consists of a matrix material (host) and a dopant, which is admixed with the host by co-evaporation. The cathode is formed by an LiF layer with a thickness of 1 nm and an Al layer with a thickness of 100 nm deposited on top. Table 1 shows the chemical structures of the materials used to build up the OLEDs.

These OLEDs are characterised by standard methods; for this purpose, the electroluminescence spectra, the efficiency (measured in cd/A), the power efficiency (measured in lm/W) as a function of the luminance, calculated from current-voltage-luminance characteristic lines (IUL characteristic lines), and the lifetime are determined. The lifetime is defined as the time after which the initial luminance of 25,000 cd/m$^2$ or 6000 cd/m$^2$ has dropped to half. The use voltage is defined as the voltage at which the OLED achieves a luminance of 1 cd/m$^2$.

Table 2 shows the results for two OLEDs (Examples 9.1 and 9.2) which demonstrate the use of the compounds according to the invention as hole-transport materials. The hole-transport material (HTM) according to the invention used is compound HTM1 from Table 1. As comparison, compound NPB in accordance with the prior art is used. Compared with the prior art, compound HTM1 is distinguished over NPB by increased efficiency and lifetime with virtually unchanged operating and use voltage.

Examples 9.3 and 9.4 show blue-emitting OLEDs, where dopant D2 in accordance with the prior art is used in 9.3 and dopant D3 according to the invention is used in 9.4. As can be seen, the substance according to the invention exhibits significantly darker-blue colour coordinates, i.e. a lower CIE y value. Nevertheless, D3 exhibits similar current efficiency (measured in cd/A), i.e. the quantum efficiency is significantly improved compared with the prior art, which is also shown in Table 2. A further advantage of compound D3 according to the invention is the improved lifetime compared with compound D2 in accordance with the prior art: although D3 exhibits darker-blue colour coordinates and therefore has to be operated at significantly higher current than D2 for the initial luminance of 6000 cd/m$^2$ used, a significant improvement in the lifetime of almost 50% is obtained using the compound according to the invention. This shows that D3 has higher intrinsic stability than D2.

TABLE 1

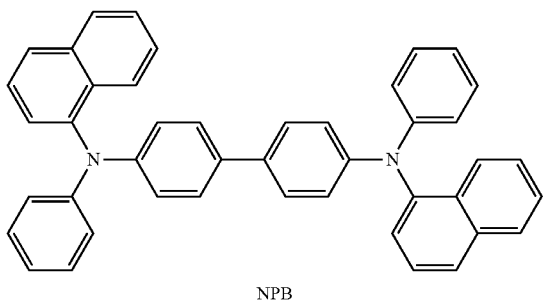

NPB

TABLE 1-continued
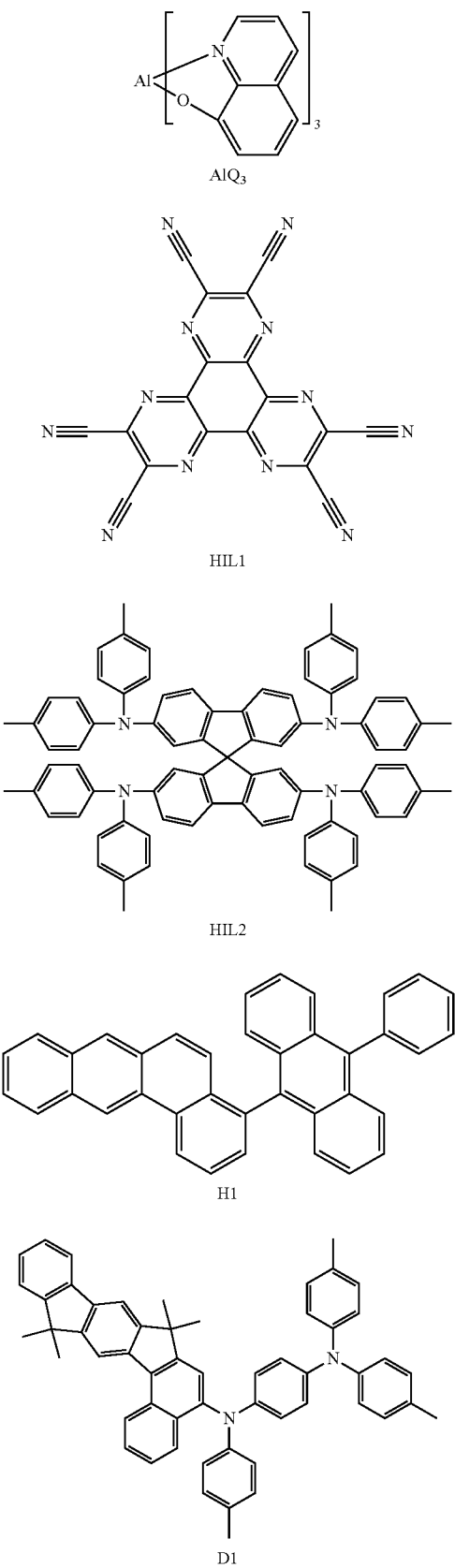
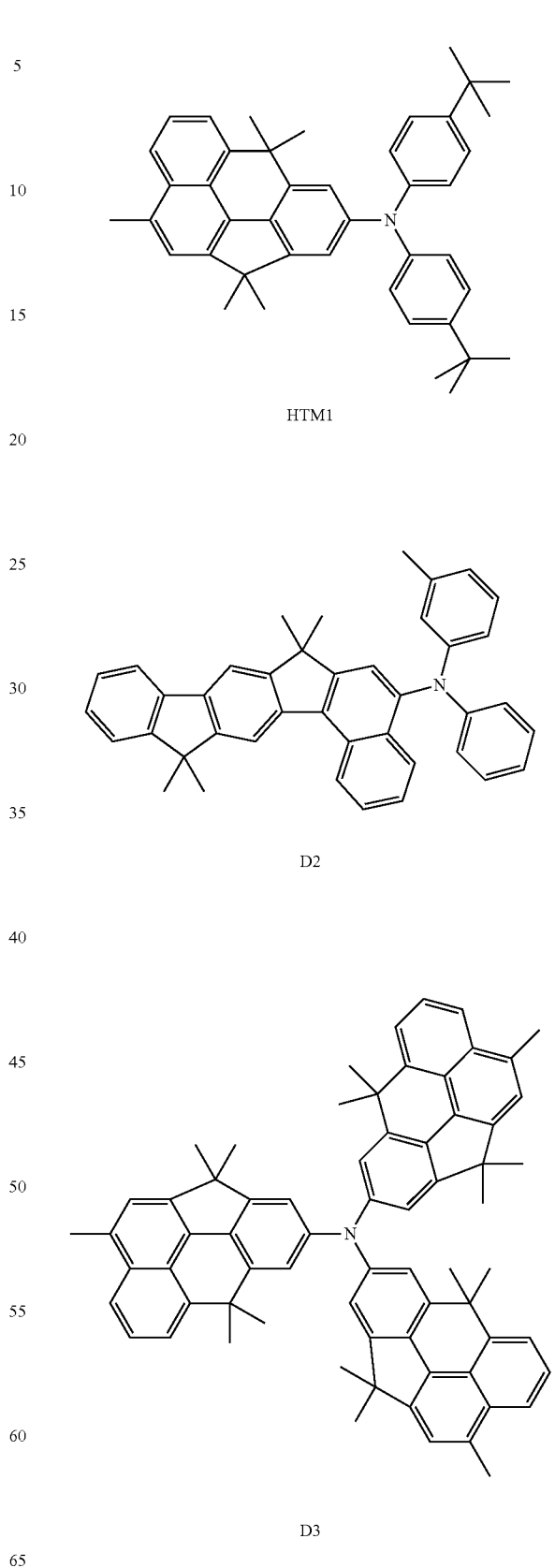

TABLE 2

| Example | EML | HTM | Use voltage | Voltage for 1000 cd/m² | Efficiency at 1000 cd/m² | EQE at 1000 cd/m² | Colour | CIE x/y at 1000 cd/m² | |
|---|---|---|---|---|---|---|---|---|---|
| | | | | | | | | | Lifetime for 25,000 cd/m² |
| 9.1 | H1 + 10% of D1 | NPB | 2.8 V | 5.0 V | 17.1 cd/A | 5.0% | green | 0.28/0.61 | 390 h |
| 9.2 | H1 + 10% of D1 | HTM1 | 2.7 V | 5.1 V | 19.2 cd/A | 5.7% | green | 0.28/0.60 | 420 h |
| | | | | | | | | | Lifetime for 6000 cd/m² |
| 9.3 | H1 + 5% of D2 | NPB | 3.3 V | 6.4 V | 5.1 cd/A | 4.2% | blue | 0.142/0.151 | 110 h |
| 9.4 | H1 + 5% of D3 | NPB | 3.2 V | 6.1 V | 5.4 cd/A | 5.2% | blue | 0.143/0.111 | 160 h |

The invention claimed is:

1. A compound of the formula (1), (2), (3), (4) or (5):

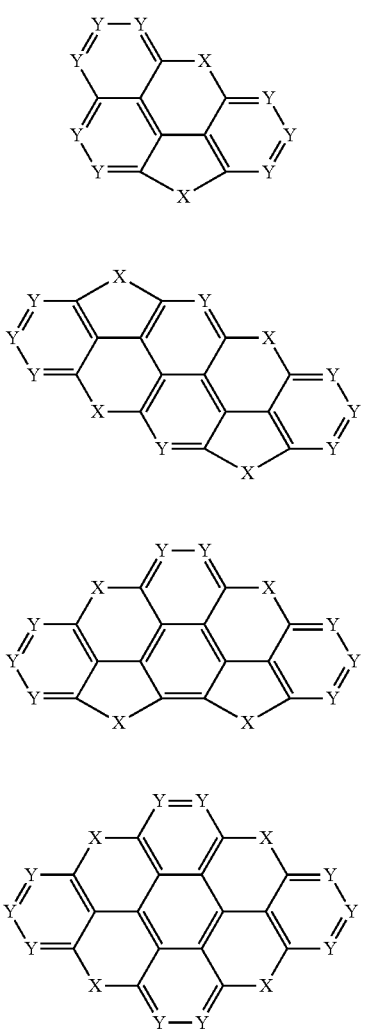

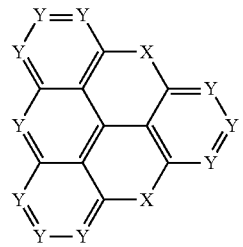

wherein

X is in each case, independently of one another, a divalent bridge selected from $B(R^1)$, $C(R^1)_2$, $Si(R^1)_2$, $C=NR^1$, $C=C(R^1)_2$, O, S, C=O, S=O, $SO_2$, $N(R^1)$, $P(R^1)$ or $P(=O)R^1$;

$X^1$ is in each case, independently of one another, a divalent bridge selected from $B(R^1)$, $C(R^1)_2$, $Si(R^1)_2$, $C=NR^1$, $C=C(R^1)_2$, O, S, S=O, $SO_2$, $N(R^1)$, $P(R^1)$ or $P(=O)R^1$;

Y is in each case, independently of one another, CR or N;

R is in each case, independently of one another, H, D, F, Cl, Br, I, $N(R^2)_2$, $N(Ar)_2$, $C(=O)Ar$, $P(=O)Ar_2$, $S(=O)Ar$, $S(=O)_2Ar$, $CR^2=CR^2Ar$, CN, $NO_2$, $Si(R^2)_3$, $B(OR^2)_2$, $OSO_2R^2$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals $R^2$, where one or more non-adjacent $CH_2$ groups is optionally replaced by $R^2C=CR^2$, $C\equiv C$, $Si(R^2)_2$, $Ge(R^2)_2$, $Sn(R^2)_2$, C=O, C=S, C=Se, $C=NR^2$, $P(=O)(R^2)$, SO, $SO_2$, $NR^2$, O, S or $CONR^2$ and where one or more H atoms is optionally replaced by D, F, Cl, Br, I, CN or $NO_2$, or an aromatic or heteroaromatic ring system having 5 to 40 aromatic ring atoms, which may in each case be substituted by one or more non-aromatic radicals R, or an aryloxy or heteroaryloxy group having 5 to 40 aromatic ring atoms, which is optionally substituted by one or more non-aromatic radicals R, or a combination of these systems;

is in each case, independently of one another, D, F, Cl, Br, I, CN, $NO_2$, $B(OR^2)_2$, $Si(R^2)_3$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals $R^2$, where one or more non-adjacent $CH_2$ groups is optionally replaced by $-R^2C=CR^2-$, $-C\equiv C-$, $Si(R^2)_2$, $Ge(R^2)_7$, $Sn(R^2)_2$, $C=O$, $C=S$, $C=Se$, $C=NR^2$, $-O-$, $-S-$, $-COO-$ or $-CONR^2-$ and where one or more H atoms is optionally replaced by D, F, Cl, Br, I, CN or $NO_2$, or an arylamine or a substituted carbazole, each of which is optionally substituted by one or more radicals $R^2$, or an aromatic or hetero-aromatic ring system having 5 to 40 aromatic ring atoms, which is optionally substituted by one or more non-aromatic radicals $R^1$, or an aryloxy or heteroaryloxy group having 5 to 40 aromatic ring atoms, which is optionally substituted by one or more non-aromatic radicals $R^1$, or a combination of these systems;

$R^2$ is in each case, independently of one another, H, D or an aliphatic or aromatic hydrocarbon radical having 1 to 20 C atoms;

Ar is in each case, independently of one another, an aromatic or heteroaromatic ring system having 5 to 40 aromatic ring atoms, which is optionally substituted by one or more non-aromatic radicals $R^1$; two groups Ar here which are bonded to the same atom may also be connected to one another by a single bond or a divalent group $C(R^1)_2$, and where the following two compounds are not covered by the claim:

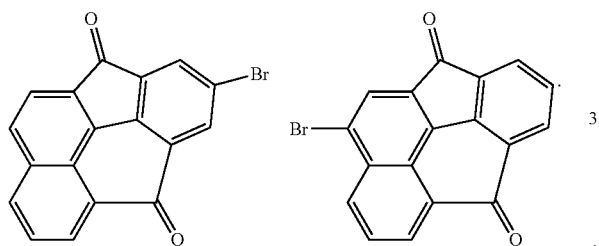

2. The compound according to claim 1, wherein the group X is selected, identically or differently on each occurrence, from $C(R^1)_2$, $NR^1$, O, S or C=O.

3. The compound according to claim 1, wherein a maximum of two symbols Y in the formulae (1) to (5) stand for N and the other symbols Y stand for CR.

4. The compound according to claim 1, wherein the symbol R stands, identically or differently on each occurrence, for H, D, F, $N(Ar)_2$, CN, a straight-chain alkyl or alkoxy group having 1 to 20 C atoms or a branched or cyclic alkyl or alkoxy group having 3 to 20 C atoms, each of which is optionally substituted by one or more radicals $R^2$, where one or more H atoms is optionally replaced by F, or an aromatic or heteroaromatic ring system having 5 to 25 aromatic ring atoms, which may in each case be substituted by one or more non-aromatic radicals R, or a combination of these systems.

5. The compound according to claim 1, wherein the symbol $R^1$ stands, identically or differently on each occurrence, for D, a straight-chain alkyl or alkoxy group having 1 to 20 C atoms or a branched or cyclic alkyl or alkoxy group having 3 to 20 C atoms, each of which is optionally substituted by one or more radicals $R^2$, where one or more H atoms is optionally replaced by F, or an aromatic or heteroaromatic ring system having 5 to 25 aromatic ring atoms, which is optionally substituted by one or more non-aromatic radicals $R^1$, or a combination of these systems.

6. The compound according to claim 1, wherein

X is selected, identically or differently on each occurrence, from $C(R^1)_2$, $NR^1$, O, S or C=O;

Y is, identically or differently on each occurrence, CR or N, where a maximum of one or two symbols Y in the formulae (1) to (5) stand for N;

R is on each occurrence, identically or differently, H, D, F, $N(Ar)_2$, CN, a straight-chain alkyl or alkoxy group having 1 to 20 C atoms or a branched or cyclic alkyl or alkoxy group having 3 to 20 C atoms, each of which is optionally substituted by one or more radicals $R^2$, where one or more H atoms is optionally replaced by F, or an aromatic or heteroaromatic ring system having 5 to 25 aromatic ring atoms, which may in each case be substituted by one or more non-aromatic radicals R, or a combination of these systems;

$R^1$ is, identically or differently on each occurrence, D, a straight-chain alkyl or alkoxy group having 1 to 20 C atoms or a branched or cyclic alkyl or alkoxy group having 3 to 20 C atoms, each of which is optionally substituted by one or more radicals $R^2$, where one or more H atoms is optionally replaced by F, or an aromatic or heteroaromatic ring system having 5 to 25 aromatic ring atoms, which is optionally substituted by one or more non-aromatic radicals $R^1$, or a combination of these systems.

7. The compound according to claim 1, wherein

X is selected, identically or differently on each occurrence, from $C(R^1)_2$;

Y is, identically or differently on each occurrence, CR;

R is on each occurrence, identically or differently, H, $N(Ar)_2$, a straight-chain alkyl group having 1 to 10 C atoms or a branched or cyclic alkyl group having 3 to 40 C atoms or an aromatic or heteroaromatic ring system having 5 to 25 aromatic ring atoms, which may in each case be substituted by one or more non-aromatic radicals R;

$R^1$ is, identically or differently on each occurrence, H, a straight-chain alkyl group having 1 to 10 C atoms or a branched or cyclic alkyl group having 3 to 10 C atoms, or an aromatic or heteroaromatic ring system having 5 to 10 aromatic ring atoms, which is optionally substituted by one or more non-aromatic radicals $R^1$.

8. The compound according to claim 1, wherein

X is selected, identically or differently on each occurrence, from $C(R^1)_2$;

Y is, identically or differently on each occurrence, CR;

R is on each occurrence, identically or differently, H, $N(Ar)_2$, a straight-chain alkyl group having 1 to 10 C atoms or a branched or cyclic alkyl group having 3 to 40 C atoms, or an aromatic or heteroaromatic ring system having 5 to 25 aromatic ring atoms, which may in each case be substituted by one or more non-aromatic radicals R;

$R^1$ is, identically or differently on each occurrence, H, a methyl group, a branched or cyclic alkyl group having 3 to 10 C atoms, or a phenyl group, which is optionally substituted by one or more non-aromatic radicals $R^1$.

9. The compound according to claim 1, selected from the formulae (1a) to (5a):

formula (1a)

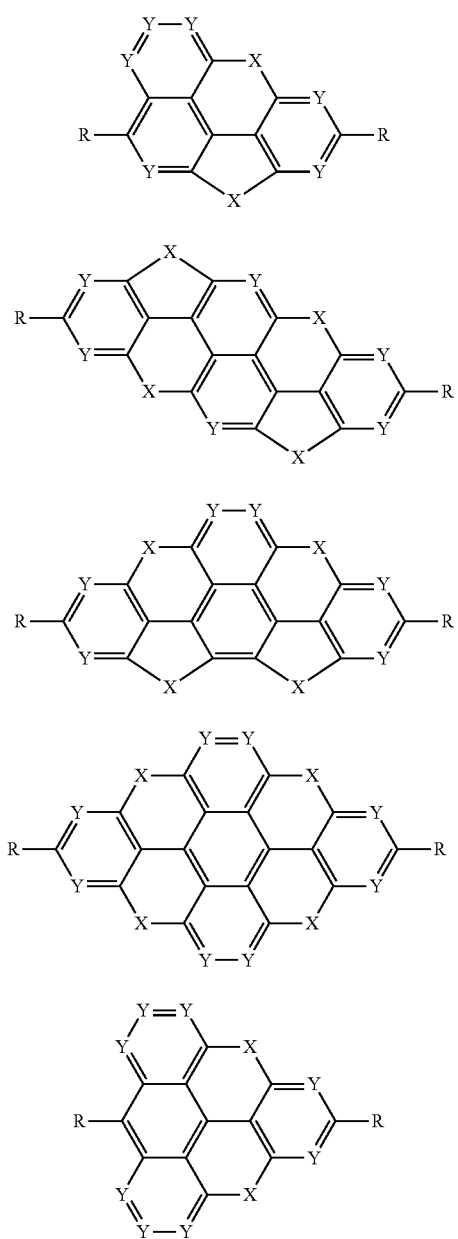

formula (2a)

formula (3a)

formula (5a)

formula (4a)

where the symbols used have the meanings mentioned in claim 1, and a maximum of two symbols Y in each structure stand for N.

10. The compound according to claim 1, selected from the compound of the formulae (1b) to (5b):

formula (1b)

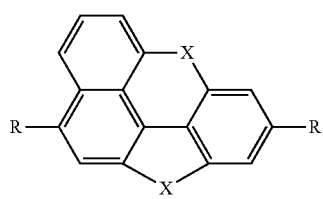

formula (2b)

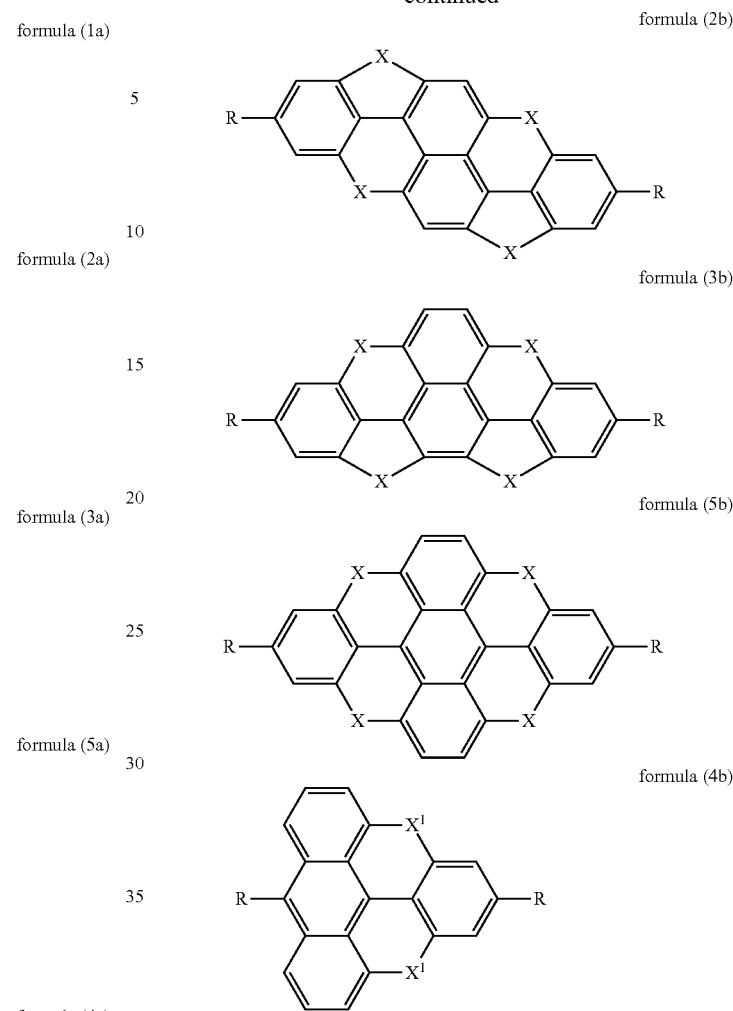

formula (3b)

formula (5b)

formula (4b)

where R, $X^1$ and X have the meanings mentioned in claim 1.

11. A process for the preparation of the compounds according to claim 1, comprising the steps of
 a) coupling a functionalised naphthalene or a functionalised anthracene or a corresponding other functionalised aromatic compound to an aromatic and/or heteroaromatic compound, and
 b) forming one or more divalent bridges between the naphthalene or the anthracene and the aromatic and/or heteroaromatic compound via a ring-closure reaction.

12. The process according to claim 11, which further comprises the following reaction steps:
 c) functionalisation of the parent structure obtained by steps a) and b) by chlorination, bromination or iodination,
 d) followed by Hartwig-Buchwald coupling to an aromatic amine or Suzuki coupling to an arylboronic acid or an arylboronic acid derivative or a polymerisation.

13. An organic electronic device comprising the compound according to claim 1.

14. The organic electronic device as claimed in claim 13, wherein the device is in an organic light-emitting diode (OLED), an organic integrated circuit (O-IC), an organic field-effect transistor (O-FET), an organic thin-film transistor (O-TFT), an organic light-emitting transistor (O-LET), an organic solar cell (O-SC), an organic optical detector, an organic photoreceptor, an organic field-quench device (O-FQD), a light-emitting electrochemical cell (LEC) or an organic laser diode (O-laser).

15. An organic layer comprising one or more compounds according to claim 1.

16. An organic electronic device according to claim 13, wherein the compound is employed as emitting compound in an emitting layer and/or as host material for fluorescent or phosphorescent emitters in an emitting layer and/or as hole-transport material in a hole-injection or hole-transport layer and/or as electron-blocking material in an electron-blocking layer and/or as hole-blocking material in a hole-blocking layer and/or as electron-transport material in an electron-injection or electron-transport layer.

17. A dimer, oligomer, polymer or dendrimer comprising one or more compounds of the formula (1), (2), (3), (4) or (5),

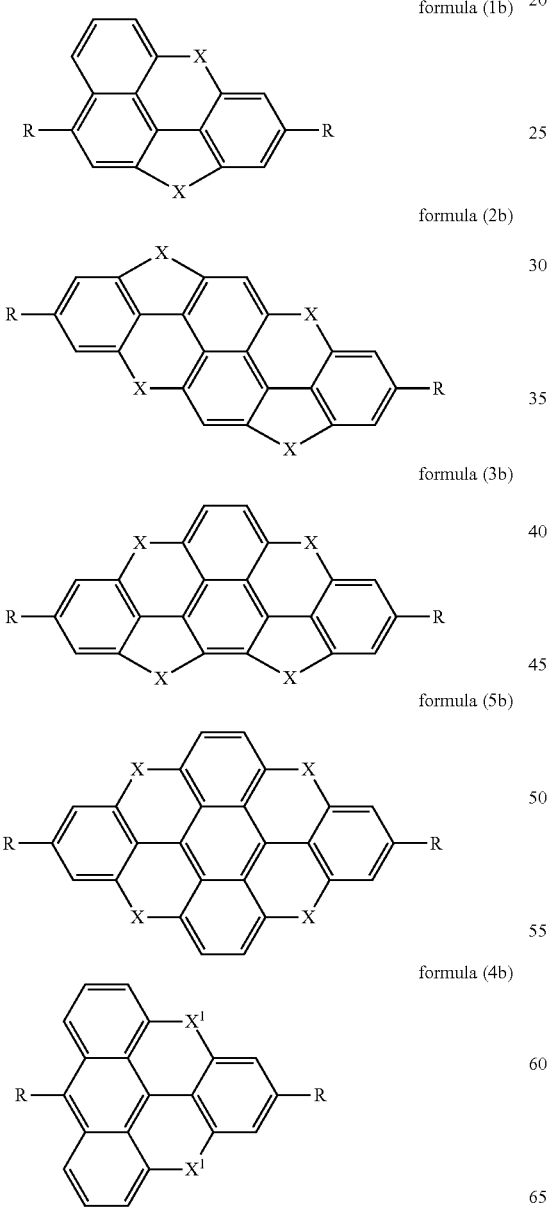

formula (1b)

formula (2b)

formula (3b)

formula (5b)

formula (4b)

wherein

X is in each case, independently of one another, a divalent bridge selected from $B(R^1)$, $C(R^1)_2$, $Si(R^1)_2$, $C=NR^1$, $C=C(R^1)_2$, O, S, C=O, S=O, $SO_2$, $N(R^1)$, $P(R^1)$ or $P(=O)R^1$;

$X^1$ is in each case, independently of one another, a divalent bridge selected from $B(R^1)$, $C(R^1)_2$, $Si(R^1)_2$, $C=NR^1$, $C=C(R^1)_2$, O, S, S=O, $SO_2$, $N(R^1)$, $P(R^1)$ or $P(=O)R^1$;

Y is in each case, independently of one another, CR or N;

R is in each case, independently of one another, H, D, F, Cl, Br, I, $N(R^2)_2$, $N(Ar)_2$, $C(=O)Ar$, $P(=O)Ar_2$, $S(=O)Ar$, $S(=O)_2Ar$, $CR^2=CR^2Ar$, CN, $NO_2$, $Si(R^2)_3$, $B(OR^2)_2$, $OSO_2R^2$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals $R^2$, where one or more non-adjacent $CH_2$ groups is optionally replaced by $R^2C=CR^2$, C≡C, $Si(R^2)_2$, $Ge(R^2)_2$, $Sn(R^2)_2$, C=O, C=S, C=Se, $C=NR^2$, $P(=O)(R^2)$, SO, $SO_2$, $NR^2$, O, S or $CONR^2$ and where one or more H atoms is optionally replaced by D, F, Cl, Br, I, CN or $NO_2$, or an aromatic or heteroaromatic ring system having 5 to 40 aromatic ring atoms, which may in each case be substituted by one or more non-aromatic radicals R, or an aryloxy or heteroaryloxy group having 5 to 40 aromatic ring atoms, which is optionally substituted by one or more non-aromatic radicals R, or a combination of these systems;

$R^1$ is in each case, independently of one another, D, F, Cl, Br, I, CN, $NO_2$, $B(OR^2)_2$, $Si(R^2)_3$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals $R^2$, where one or more non-adjacent $CH_2$ groups is optionally replaced by —$R^2C=CR^2$—, —C≡C—, $Si(R^2)_2$, $Ge(R^2)_2$, $Sn(R^2)_2$, C=O, C=S, C=Se, $C=NR^2$, —O—, —S—, —COO— or —$CONR^2$— and where one or more H atoms is optionally replaced by D, F, Cl, Br, I, CN or $NO_2$, or an arylamine or a substituted carbazole, each of which is optionally substituted by one or more radicals $R^2$, or an aromatic or heteroaromatic ring system having 5 to 40 aromatic ring atoms, which is optionally substituted by one or more non-aromatic radicals $R^1$, or an aryloxy or heteroaryloxy group having 5 to 40 aromatic ring atoms, which is optionally substituted by one or more non-aromatic radicals $R^1$, or a combination of these systems;

$R^2$ is in each case, independently of one another, H, D or an aliphatic or aromatic hydrocarbon radical having 1 to 20 C atoms;

Ar is in each case, independently of one another, an aromatic or heteroaromatic ring system having 5 to 40 aromatic ring atoms, which is optionally substituted by one or more non-aromatic radicals $R^1$; two groups Ar here which are bonded to the same atom may also be connected to one another by a single bond or a divalent group $C(R^1)_2$, and wherein one or more radicals R represent bonds to the next recurring unit.

18. The compound according to claim 1, wherein $R^1$ is in each case, independently of one another, F, Cl, Br, I, CN, $NO_2$, $B(OR^2)_2$, $Si(R^2)_3$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals $R^2$, where one or more non-adjacent $CH_2$ groups is optionally replaced by —$R^2C$=$CR^2$—, —C≡C—, $Si(R^2)_2$, $Ge(R^2)_2$, $Sn(R^2)_2$, C=O, C=S, C=Se, C=$NR^2$, —O—, —S—, —COO— or —$CONR^2$— and where one or more H atoms is optionally replaced by D, F, Cl, Br, I, CN or $NO_2$, or an arylamine or a substituted carbazole, each of which is optionally substituted by one or more radicals $R^2$, or an aromatic or heteroaromatic ring system having 5 to 40 aromatic ring atoms, which is optionally substituted by one or more non-aromatic radicals $R^1$, or an aryloxy or heteroaryloxy group having 5 to 40 aromatic ring atoms, which is optionally substituted by one or more non-aromatic radicals $R^1$, or a combination of these systems.

* * * * *